(12) United States Patent
Zhang et al.

(10) Patent No.: US 12,354,544 B2
(45) Date of Patent: Jul. 8, 2025

(54) DRIVING CIRCUIT, DRIVING METHOD AND DISPLAY DEVICE

(71) Applicant: BOE TECHNOLOGY GROUP CO., LTD., Beijing (CN)

(72) Inventors: Xing Zhang, Beijing (CN); Pan Xu, Beijing (CN); Donghui Zhao, Beijing (CN); Ying Han, Beijing (CN); Chengyuan Luo, Beijing (CN); Guangshuang Lv, Beijing (CN); Cheng Xu, Beijing (CN); Miao Liu, Beijing (CN); Dandan Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/281,110

(22) PCT Filed: Nov. 30, 2022

(86) PCT No.: PCT/CN2022/135249
§ 371 (c)(1),
(2) Date: Sep. 8, 2023

(87) PCT Pub. No.: WO2024/113203
PCT Pub. Date: Jun. 6, 2024

(65) Prior Publication Data
US 2025/0029558 A1    Jan. 23, 2025

(51) Int. Cl.
*G09G 3/3233* (2016.01)
*G11C 19/28* (2006.01)

(52) U.S. Cl.
CPC ........... *G09G 3/3233* (2013.01); *G11C 19/28* (2013.01); *G09G 2300/0852* (2013.01);
(Continued)

(58) Field of Classification Search
CPC ....... G11C 19/28; G11C 19/184; G11C 27/04; G09G 2310/0286
See application file for complete search history.

(56) References Cited

U.S. PATENT DOCUMENTS

2016/0125847 A1  5/2016  Gu
2019/0340975 A1  11/2019  Zhai
(Continued)

FOREIGN PATENT DOCUMENTS

CN    104282287 A    1/2015
CN    111210776 A    5/2020
(Continued)

OTHER PUBLICATIONS

CN-113421528-A (Year: 2021).*

*Primary Examiner* — Sanjiv D. Patel
(74) *Attorney, Agent, or Firm* — MUNCY, GEISSLER, OLDS & LOWE, P.C.

(57) ABSTRACT

A driving circuit, a driving method and a display device are provided. The driving circuit includes a first control node control circuit, a second control node control circuit, a first node control circuit and a second node control circuit, wherein, the first control node control circuit is configured to control a potential of the first control node; the second control node control circuit is configured to control a potential of the second control node; the first node control circuit is configured to control a potential of the first node; the second node control circuit is electrically connected to the second control node, a first clock signal terminal and a second node respectively, and is configured to control to connect the first clock signal terminal and the second node under the control of the potential of the second control node.

18 Claims, 14 Drawing Sheets

(52) U.S. Cl.
CPC ............... *G09G 2310/0286* (2013.01); *G09G 2310/061* (2013.01); *G09G 2310/08* (2013.01)

(56) References Cited

U.S. PATENT DOCUMENTS

| | | |
|---|---|---|
| 2022/0246100 A1 | 8/2022 | Long et al. |
| 2022/0319374 A1 | 10/2022 | Xu et al. |
| 2022/0343841 A1 | 10/2022 | Shang et al. |
| 2023/0084070 A1 | 3/2023 | Feng et al. |

FOREIGN PATENT DOCUMENTS

| | | | |
|---|---|---|---|
| CN | 111243649 A | | 6/2020 |
| CN | 111445832 A | | 7/2020 |
| CN | 111326109 B | | 9/2021 |
| CN | 113421528 A | * | 9/2021 |
| CN | 113763886 A | | 12/2021 |
| CN | 113889022 A | | 1/2022 |
| CN | 114842900 A | | 8/2022 |
| CN | 114945969 A | | 8/2022 |
| CN | 115019731 A | | 9/2022 |

\* cited by examiner

DRIVING CIRCUIT, DRIVING METHOD AND DISPLAY DEVICE

CROSS-REFERENCE TO RELATED APPLICATION

The present disclosure is the U.S. national phase of PCT Application No. PCT/CN2022/135249 filed on Nov. 30, 2022, which are incorporated herein by reference in their entireties.

TECHNICAL FIELD

The present disclosure relates to the field of display technology, in particular to a driving circuit, a driving method and a display device.

BACKGROUND

In the related art, for medium-sized display products, compared with external compensation technology, internal compensation technology does not require expensive Field Programmable Gate Array (FPGA) or Application Specific Integrated Circuit (ASIC) chips, and an external source driving (source driving), a bulky Tcon (timing controller) is not necessary, and which has the advantages of a simple driving system and low cost. At the same time, compared with the external pixel circuit, the internal pixel circuit has a more complex structure of the pixel driving part, that is, the corresponding number of Gate On Array (GOAs, gate driving circuits arranged on the array substrate) will be more, and the GOA has a low stability.

SUMMARY

In a first aspect, the present disclosure provides in some embodiments a driving circuit, including a first control node control circuit, a second control node control circuit, a first node control circuit and a second node control circuit, wherein, the first control node control circuit is configured to control a potential of a first control node; the second control node control circuit is configured to control a potential of a second control node; the first node control circuit is configured to control a potential of a first node; the second node control circuit is electrically connected to the second control node, a first clock signal terminal and a second node respectively, and is configured to control to connect the first clock signal terminal and the second node under the control of the potential of the second control node.

Optionally, the driving circuit further includes a third node control circuit and a fourth node control circuit; wherein the third node control circuit is electrically connected to the first control node, a third node and the first clock signal terminal respectively, and is configured to control to connect the third node and the first clock signal terminal under the control of the potential of the first control node, and control a potential of the third node according to the potential of the first control node; the fourth node control circuit is configured to control to connect the third node and a fourth node under the control of a first clock signal provided by the first clock signal terminal, control to connect the fourth node and a first voltage terminal under the control of the potential of the first node; the second node control circuit is further configured to control the potential of the second node according to the potential of the second control node.

Optionally, the first node control circuit is electrically connected to the first node, the first clock signal terminal and the fourth node, and is configured to control to connect the fourth node and the first node under the control of the first clock signal.

Optionally, the first node control circuit is also electrically connected to the second node and the second voltage terminal, and is configured to control to connect the first node and the second voltage terminal under the control of the potential of the second node.

Optionally, the third node control circuit is also be electrically connected to the second node and a second voltage terminal, is configured to control to connect the third node and the second voltage terminal under the control of the potential of the second node.

Optionally, the driving circuit further includes a driving signal output terminal, a second output circuit, a third output circuit and a fifth node control circuit, wherein, the second output circuit is electrically connected to the second node, the driving signal output terminal and the fifth node, and is configured to control to connect the driving signal output terminal and the fifth node under the control of the potential of the second node; the third output circuit is electrically connected to the second node, the fifth node, and a second voltage terminal, and is configured to control to connect the fifth node and the second voltage terminal under the control of the potential of the second node; the fifth node control circuit is electrically connected to the fifth node and the driving signal output terminal, and the fifth node control circuit is also electrically connected to a third voltage terminal or the first voltage terminal, and is configured to control to connect the fifth node and the third voltage terminal or the first voltage terminal under the control of a driving signal provided by the driving signal output terminal.

Optionally, the first control node control circuit is respectively electrically connected to the first control node, the first clock signal terminal, the second control node and the second voltage terminal, is configured to control to connect the first control node and the second voltage terminal under the control of a first clock signal provided by the first clock signal terminal and the potential of the second control node.

Optionally, the first control node control circuit is further electrically connected to the second clock signal terminal and an input terminal, is configured to control to connect the first control node and the input terminal under the control of a second clock signal provided by the second clock signal terminal.

Optionally, the second control node control circuit is electrically connected to the second control node, a second clock signal terminal, a reset terminal, a third voltage terminal and the first control node respectively, is configured to control to connect the second control node and the third voltage terminal under the control of a second clock signal provided by the second clock signal terminal, and control to connect the second control node and the third voltage terminal under the control of a reset signal provided by the reset terminal, control to connect the second control node and the second clock signal terminal under the control of the potential of the first control node, and control to connect the second control node and the second clock signal terminal under the control of the potential of the first control node.

Optionally, the driving circuit further includes a first output circuit; wherein the first output circuit is electrically connected to the first node and a driving signal output terminal respectively, and the first output circuit is electrically connected to a third voltage terminal or an output clock signal terminal, and is configured to control to connect the driving signal output terminal and the third voltage terminal or the output clock signal terminal under the control of the potential of the first node.

Optionally, the driving circuit further includes a first energy storage circuit and a second energy storage circuit; wherein a first terminal of the first energy storage circuit is electrically connected to the first node, and a second terminal of the first energy storage circuit is electrically connected to the driving signal output terminal; the first energy storage circuit is configured to maintain the potential of the first node; a first terminal of the second energy storage circuit is electrically connected to the second node, and a second terminal of the second energy storage circuit is electrically connected to the second voltage terminal; the second energy storage circuit is configured to maintain the potential of the second node.

Optionally, the second node control circuit comprises a first transistor; a gate electrode of the first transistor is electrically connected to the second control node, a first electrode of the first transistor is electrically connected to the first clock signal terminal, and a second electrode of the first transistor is electrically connected to the second node.

Optionally, the fourth node control circuit comprises a second transistor and a third transistor; a gate electrode of the second transistor is electrically connected to the first node, a first electrode of the second transistor is electrically connected to the first voltage terminal, and a second electrode of the second transistor is electrically connected to the fourth node; a gate electrode of the third transistor is electrically connected to the first clock signal terminal, a first electrode of the third transistor is electrically connected to the third node, and a second electrode of the third transistor is electrically connected to the fourth node.

Optionally, the fifth node control circuit comprises a fourth transistor; a gate electrode of the fourth transistor is electrically connected to the driving signal output terminal, a first electrode of the fourth transistor is electrically connected to the third voltage terminal or the first voltage terminal, and a second electrode of the fourth transistor is electrically connected to a fifth node.

Optionally, the first control node control circuit includes a fifth transistor and a sixth transistor; a gate electrode of the fifth transistor is electrically connected to the first clock signal terminal, and a first electrode of the fifth transistor is connected to the first control node; a gate electrode of the sixth transistor is electrically connected to the second control node, a first electrode of the sixth transistor is electrically connected to a second electrode of the fifth transistor, and a second electrode of the sixth transistor is electrically connected to the second voltage terminal.

Optionally, the first control node control circuit comprises a fifth transistor and a sixth transistor; a gate electrode of the fifth transistor is electrically connected to the second control node, and a first electrode of the fifth transistor is electrically connected to the first control node; a gate electrode of the sixth transistor is electrically connected to the first clock signal terminal, a first electrode of the sixth transistor is electrically connected to a second electrode of the fifth transistor, and a second electrode of the sixth transistor is electrically connected to the second voltage terminal.

Optionally, the first control node control circuit comprises a seventh transistor; a gate electrode of the seventh transistor is electrically connected to the second clock signal terminal, and a first electrode of the seventh transistor is connected to the input terminal, and a second electrode of the seventh transistor is electrically connected to the first control node.

Optionally, the third node control circuit comprises an eighth transistor and a third capacitor; a gate electrode of the eighth transistor is electrically connected to the first control node, and a first electrode of the eighth transistor is connected to the first clock signal terminal, and a second electrode of the eighth transistor is electrically connected to the third node; a first terminal of the third capacitor is electrically connected to the first control node, and a second terminal of the third capacitor is electrically connected to a third node; the second node control circuit also includes a fourth capacitor; a first terminal of the fourth capacitor is electrically connected to the second control node, and a second terminal of the fourth capacitor is electrically connected to the second node.

Optionally, the third node control circuit further comprises a ninth transistor; a gate electrode of the ninth transistor is electrically connected to the second node, a first electrode of the ninth transistor is electrically connected to the third node, and a second electrode of the ninth transistor is electrically connected to the second voltage terminal.

Optionally, the first node control circuit comprises a tenth transistor; a gate electrode of the tenth transistor is electrically connected to the first clock signal terminal, a first electrode of the tenth transistor is electrically connected to the fourth node, a second electrode of the tenth transistor is electrically connected to the first node.

Optionally, the first node control circuit comprises an eleventh transistor; a gate electrode of the eleventh transistor is electrically connected to the second node, a first electrode of the eleventh transistor is electrically connected to the first node, a second electrode of the eleventh transistor is electrically connected to the second voltage terminal.

Optionally, the second control node control circuit comprises a twelfth transistor, a thirteenth transistor, and a fourteenth transistor; a gate electrode of the twelfth transistor is electrically connected to the reset terminal, a first electrode of the twelfth transistor is electrically connected to the second control node, and a second electrode of the twelfth transistor is electrically connected to the third voltage terminal; a gate electrode of the thirteenth transistor is electrically connected to the second clock signal terminal, a first electrode of the thirteenth transistor is electrically connected to the third voltage terminal, and a second electrode of the thirteenth transistor is electrically connected to the second control node; a gate electrode of the fourteenth transistor is electrically connected to the first control node, a first electrode of the fourteenth transistor is electrically connected to the second clock signal terminal, and a second electrode of the fourteenth transistor is electrically connected to the second control node.

Optionally, the first output circuit includes a first output transistor; a gate electrode of the first output transistor is electrically connected to the first node, and a first electrode of the first output transistor is electrically connected to a third voltage terminal or an output clock signal terminal, and a second electrode of the first output transistor is electrically connected to the driving signal output terminal.

Optionally, the second output circuit includes a second output transistor, and the third output circuit includes a third output transistor; a gate electrode of the second output transistor is electrically connected to the second node, a first electrode of the second output transistor is electrically connected to the driving signal output terminal, and a second electrode of the second output transistor is electrically connected to the fifth node; a gate electrode of the third output transistor is electrically connected to the second node, a first electrode of the third output transistor is electrically connected to the fifth node, and a second electrode of the third output transistor is electrically connected to the second voltage terminal.

In a second aspect, an embodiment of the present disclosure provides a driving method, applied to the driving circuit, wherein a display period includes a first phase, a second phase and a third phase set successively; the driving method includes: in at least part of time period included in the first phase, controlling, by the second control node control circuit, the potential of the second control node to be a turn-on voltage; controlling, by the second node control circuit, to connect the second node and the first clock signal terminal under the control of the potential of the second control node; controlling, by the first node control circuit, the potential of the first node to be a turn-off voltage; in a part of time period included in the second phase, controlling, by the first control node control circuit, the potential of the first control node to be the turn-on voltage; controlling, by the second control node control circuit, the potential of the second control node to be the turn-on voltage, and controlling, by the second node control circuit, to connect the second node and the first clock signal terminal under the control of the potential of the second control node; in another part of time period included in the second phase, controlling, by the first control node control circuit, the potential of the first control node to be the turn-on voltage, controlling, by the second control node control circuit, the potential of the second control node to be the turn-off voltage, and controlling, by the second node control circuit, the potential of the second node to be the turn-off voltage, and controlling, by the first node control circuit, the potential of the first node to be the turn-on voltage; in a part of time period included in the third phase, controlling, by the first control node control circuit, the potential of the first control node to be the turn-off voltage, controlling, by the second control node control circuit, the potential of the second control node to be the turn-on voltage, and controlling, by the second node control circuit, to connect the second node and the first clock signal terminal under the control of the potential of the second control node, and controlling, by the first node control circuit, the potential of the first node to be the turn-on voltage; in another part of time period included in the third phase, controlling, by the second control node control circuit, the potential of the second control node to be the turn-on voltage, controlling, by the first node control circuit, the potential of the first node to be the turn-off voltage, and controlling, by the second node control circuit, to connect the second node and the first clock signal terminal under the control of the potential of the second control node.

In a third aspect, an embodiment of the present disclosure provides a display device including the driving circuit.

DETAILED DESCRIPTION

The following will clearly and completely describe the technical solutions in the embodiments of the present disclosure with reference to the accompanying drawings. Obviously, the described embodiments are only some of the embodiments of the present disclosure, not all of them. Based on the embodiments in the present disclosure, all other embodiments obtained by those ordinary skill in the art without making creative work belong to the protection scope of the present disclosure.

The transistors used in all the embodiments of the present disclosure may be thin film transistors or field effect transistors or other devices with the same characteristics. In the embodiments of the present disclosure, in order to distinguish the two electrodes of the transistor except the control electrode, one electrode is called the first electrode, and the other electrode is called the second electrode.

In actual operation, when the transistor is a thin film transistor or a field effect transistor, the control electrode may be a gate electrode, the first electrode may be a drain electrode, and the second electrode may be a source electrode; or, the control electrode may be a gate electrode, the first electrode may be a source electrode, and the second electrode may be a drain electrode.

Figure 1:
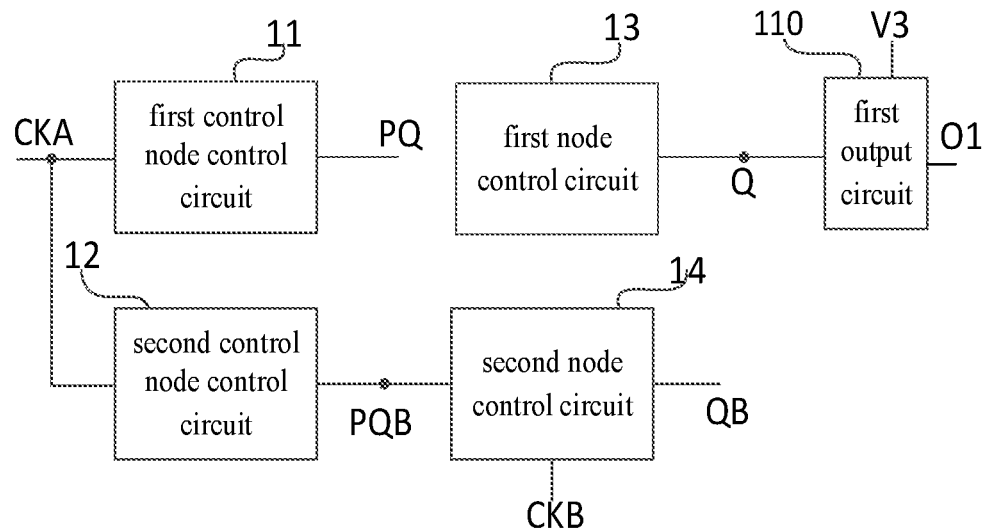
FIG. 1 is a structural diagram of a driving circuit according to an embodiment of the present disclosure.

As shown in FIG. 1, the driving circuit described in the embodiment of the present disclosure includes a first control node control circuit 11, a second control node control circuit 12, a first node control circuit 13 and a second node control circuit 14, wherein, The first control node control circuit 11 is electrically connected to a first control node PQ, is configured to control a potential of the first control node PQ;

The second control node control circuit 12 is electrically connected to a second control node PQB, is configured to control a potential of the second control node PQB;

The first node control circuit 13 is electrically connected to the first node Q, is configured to control a potential of the first node Q;

The second node control circuit 14 is electrically connected to the second control node PQB, a first clock signal terminal CKB and a second node QB respectively, and is configured to control to connect the first clock signal terminal CKB and the second node QB.

When the embodiment of the driving circuit shown in FIG. 1 of the present disclosure is working, the second node control circuit 14 controls to connect the second node QB and the first clock signal terminal CKB under the control of the potential of the second control node PQB, so that the potential of the second node QB is switched between a high level and a low level, so that the transistor controlled by the second node QB will not be in a forward stress state for a long time, and the working stability of the driving circuit is improved.

In at least one embodiment of the present disclosure, the clock signal connected to the first node control circuit 13 may be different from the clock signal connected to the first control node control circuit 11;

The clock signal connected to the first node control circuit 13 may be different from the clock signal connected to the second control node control circuit 12;

The clock signal connected to the first node control circuit 13 may be the same as the clock signal connected to the second node control circuit 14.

When at least one embodiment of the driving shown in FIG. 1 of the present disclosure is working, when the potential of PQB is the turn-on voltage (for example, when the transistor controlled by PQB is an n-type transistor, the turn-on voltage can be a high voltage, and when the potential controlled by PQB is a p-type transistor, the turn-on voltage may be a low voltage), the second node control circuit 14 controls to connect the first clock signal terminal CKB and the second node QB under the control of the potential of the second control node PQB.

In at least one embodiment shown in FIG. 1, the driving circuit described in at least one embodiment of the present disclosure may further include a first output circuit 110;

The first output circuit 110 is electrically connected to the first node Q, a third voltage terminal V3 and a driving signal output terminal O1, respectively, and is configured to control to connect the driving signal output terminal O1 and the third voltage terminal V3 under the control of the potential of the first node Q;

Both the first control node control circuit 11 and the second control node control circuit 12 may be electrically connected to the second clock signal terminal CKA; but not limited thereto.

In at least one embodiment of the driving circuit shown in FIG. 1 of the present disclosure, the first output circuit 110 may be configured to provide a light emitting control signal for the pixel circuit, but not limited thereto.

In at least one embodiment of the present disclosure, the first output circuit 110 may not be electrically connected to the third voltage terminal, but to the output clock signal terminal (the output clock signal terminal may be the first clock signal terminal or the second clock signal terminal), at this time, the driving circuit can provide a gate driving signal for the pixel circuit, but not limited thereto.

In at least one embodiment of the present disclosure, the transistors included in the driving circuit may be n-type transistors, but not limited thereto; during specific implementation, the transistors included in the driving circuit may also be p-type transistors.

The driving circuit described in at least one embodiment of the present disclosure may further include a third node control circuit and a fourth node control circuit;

The third node control circuit is electrically connected to a first control node, a third node, a fourth node and a first clock signal terminal, and is configured to control to connect the third node and the first clock signal terminal under the control of a potential of the first control node, and control a potential of the third node according to the potential of the first control node;

the fourth node control circuit is configured to control to connect the third node and the fourth node under the control of a first clock signal provided by the first clock signal terminal, and control to connect the fourth node and the first voltage terminal under the control of the potential of the first node.

In specific implementation, the driving circuit may further include a third node control circuit and a fourth node control circuit, the third node control circuit is configured to control the potential of the third node under the control of the potential of the first control node, and control the potential of the fourth node under the control of the first clock signal;

The second node control circuit is further configured to control the potential of the second node according to the potential of the second control node.

Figure 2:
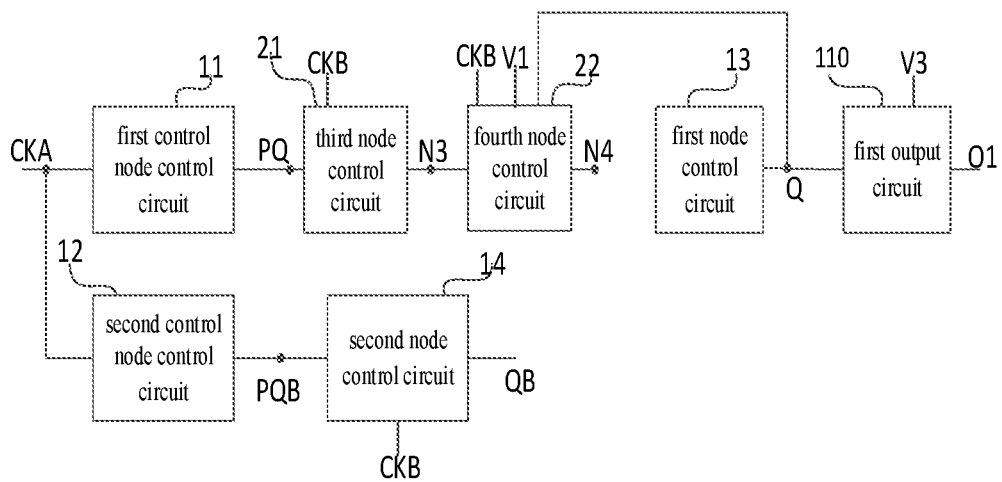
FIG. 2 is a structural diagram of a driving circuit according to at least one embodiment of the present disclosure.

As shown in FIG. 2, on the basis of the embodiment of the driving circuit shown in FIG. 1, the driving circuit described in at least one embodiment of the present disclosure may further include a third node control circuit 21 and a fourth node control circuit 22;

The third node control circuit 21 is electrically connected to the first control node PQ, the third node N3 and the first clock signal terminal CKB respectively, and is configured to control to connect the third node N3 and the first clock signal terminal CKB under the control of the potential of the first control node PQ, and control the potential of the third node N3 according to the potential of the first control node PQ;

The fourth node control circuit 22 is electrically connected to the first clock signal terminal CKB, the third node N3, the fourth node N4, the first node Q and the first voltage terminal V1, and is configured to control to connect the third node N3 and the fourth node N4 under the control of the first clock signal provided by the first clock signal terminal CKB, control to connect the fourth node N4 and the first voltage terminals V1 under the control of the potential of the first node Q;

The second node control circuit 14 is further configured to control the potential of the second node QB according to the potential of the second control node PQB.

In at least one embodiment of the present disclosure, the first voltage terminal may be the second high voltage terminal VGH2, but not limited thereto.

When at least one embodiment of the driving circuit shown in FIG. 2 of the present disclosure is working, the fourth node control circuit 22 controls to connect the fourth node N4 and the first voltage terminal V1 under the control of the potential of the first node Q, so that when the potential of the first node Q is a turned-on voltage (for example, a high voltage), it is controlled to connect the fourth node N4 and the first voltage terminal V1 (the first voltage terminal V1 may be the second high voltage terminal VGH2), so that the potential of the fourth node N4 is a high voltage, so as to prevent the potential of the first node Q from being lowered due to current leakage, so that the driving signal cannot be output correctly.

In at least one embodiment of the present disclosure, the first node control circuit is electrically connected to the first node, the first clock signal terminal and the fourth node, and is configured to control to connect the fourth node and the first node under the control of the first clock signal.

In a specific implementation, the first node control circuit may also control to connect the first node and the fourth node under the control of the first clock signal.

Optionally, the first node control circuit is also electrically connected to the second node and the second voltage terminal, and is configured to control to connect the first node and the second voltage terminal under the control of the potential of the second node.

In a specific implementation, the first node control circuit may also control to connect the first node and the second voltage terminal under the control of the potential of the second node.

In at least one embodiment of the present disclosure, the second voltage terminal may be a low voltage terminal, but not limited thereto.

Figure 3:
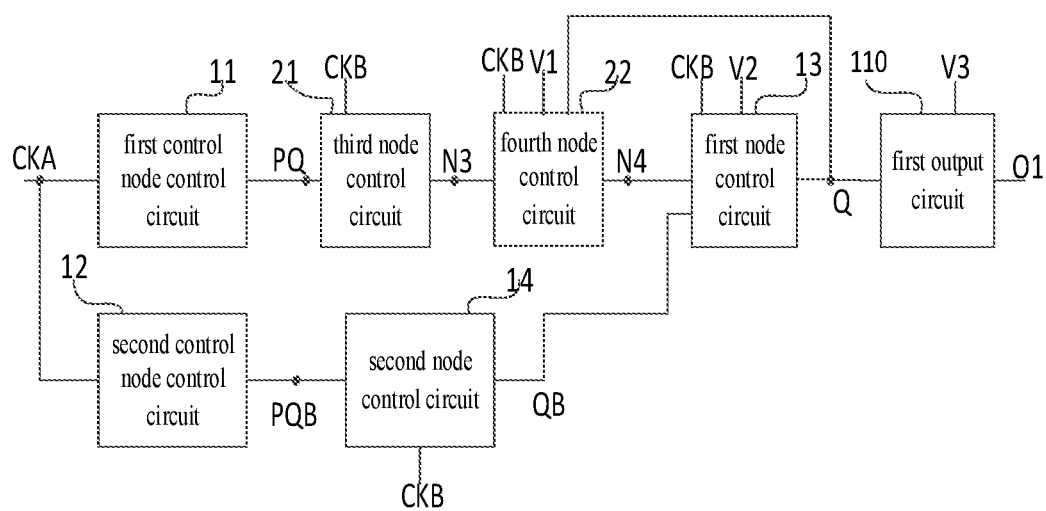
FIG. 3 is a structural diagram of a driving circuit according to at least one embodiment of the present disclosure.

As shown in FIG. 3, on the basis of at least one embodiment of the driving circuit described in FIG. 2, the first node control circuit 13 is respectively connected to the first node Q, the second node QB, the first clock signal terminal CKB, the fourth node N4 and the second voltage terminal V2, and is configured to control to connect the fourth node N4 and the first node Q under the control of the first clock signal provided by the first clock signal terminal CKB, control to connect the first node Q and the second voltage terminal V2 under the control of the potential of the second node QB.

Optionally, the third node control circuit may also be electrically connected to the second node and the second voltage terminal, is configured to control to connect the third node and the second voltage terminal under the control of the potential of the second node.

In a specific implementation, the third node control circuit can control the potential of the first node Q under the control of the potential of the second node.

Figure 4:
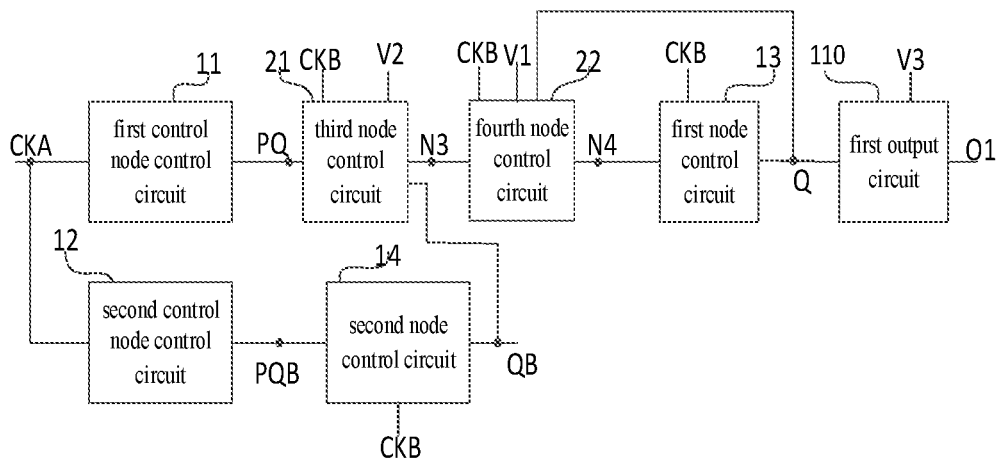
FIG. 4 is a structural diagram of a driving circuit according to at least one embodiment of the present disclosure.

As shown in FIG. 4, on the basis of at least one embodiment of the driving circuit shown in FIG. 2, the first node control circuit 13 is electrically connected to the first node Q, the first clock signal terminal CKB and the fourth node N4 respectively, is configured to control to connect the fourth node N4 and the first node Q under the control of the first clock signal;

The third node control circuit 21 can also be electrically connected to the second node QB and the second voltage terminal V2 respectively, is configured to control to connect the third node N3 and the second voltage terminal V2 under the control of the potential of the second node QB.

The driving circuit according to at least one embodiment of the present disclosure further includes a driving signal output terminal, a second output circuit, a third output circuit and a fifth node control circuit, wherein, The second output circuit is electrically connected to the second node, the driving signal output terminal and the fifth node, and is configured to control to connect the driving signal output terminal and the fifth node under the control of the potential of the second node;

The third output circuit is electrically connected to the second node, the fifth node, and the second voltage terminal, and is configured to control to connect the fifth node and the second voltage terminal under the control of the potential of the second node;

The fifth node control circuit is electrically connected to the fifth node and the driving signal output terminal, and the fifth node control circuit is also electrically connected to the third voltage terminal or the first voltage terminal, and is configured to control to connect the fifth node and the third voltage terminal or the first voltage terminal under the control of the driving signal provided by the driving signal output terminal.

In specific implementation, the driving circuit may also include a second output circuit, a third output circuit and a fifth node control circuit, the second output circuit and the third output circuit control the driving signal outputted by the driving signal output terminal under the control of the potential of the second node, the fifth node control circuit controls the potential of the fifth node under the control of the driving signal.

Figure 5:
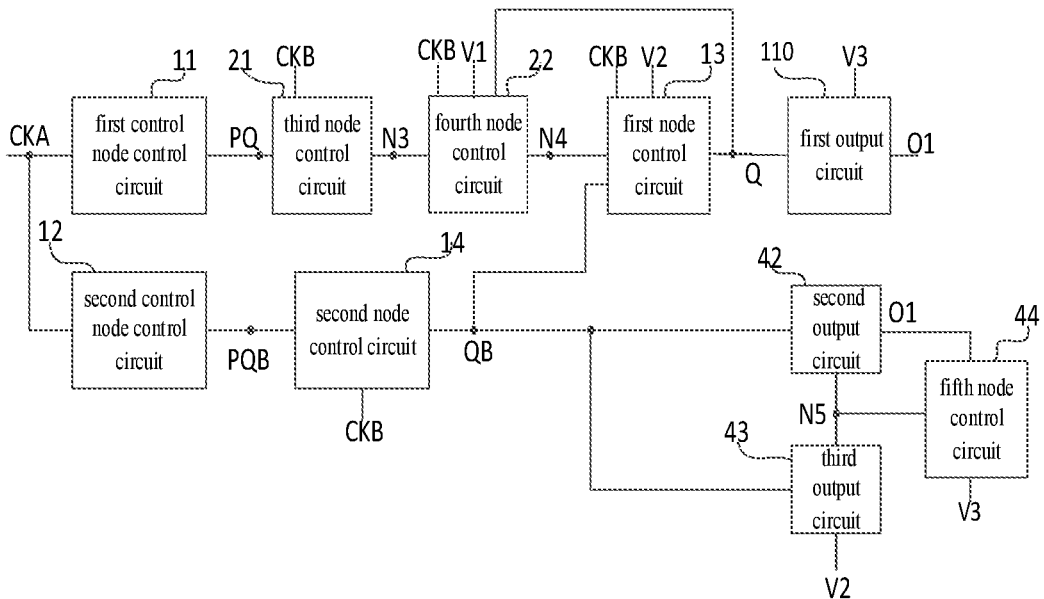
FIG. 5 is a structural diagram of a driving circuit according to at least one embodiment of the present disclosure.

As shown in FIG. 5, on the basis of at least one embodiment of the driving circuit shown in FIG. 3, the driving circuit further includes the driving signal output terminal O1, the second output circuit 42, the third output circuit 43 and the fifth node control circuit 44, wherein, The second output circuit 42 is electrically connected to the second node QB, the driving signal output terminal O1 and the fifth node N5, respectively, and is configured to control to connect the driving signal output terminal O1 and the fifth node N5 under the control of the potential of the second node QB;

The third output circuit 43 is electrically connected to the second node QB, the fifth node N5 and the second voltage terminal V2 respectively, and is configured to control to connect the fifth node N5 and the second voltage terminal V2 under the control of the potential of the second node QB;

The fifth node control circuit 44 is electrically connected to the fifth node N5 and the driving signal output terminal O1 respectively, and the fifth node control circuit is also electrically connected to the third voltage terminal V3, is configured to control to connect the fifth node N5 and the third voltage terminal V3 under the control of the driving signal provided by the driving signal output terminal O1.

In at least one embodiment of the present disclosure, the third voltage terminal V3 may be the first high voltage terminal VGH, but not limited thereto.

When at least one embodiment of the driving circuit shown in FIG. 5 of the present disclosure is in operation, the fifth node control circuit 44 controls to connect the fifth node N5 and the third voltage terminal V3 (the third voltage terminal V3 can be the first high voltage terminal VGH), so as to prevent the potential of the driving signal outputted by the driving signal output terminal O1 from being lowered due to current leakage, so as to output the driving signal normally.

Figure 6:
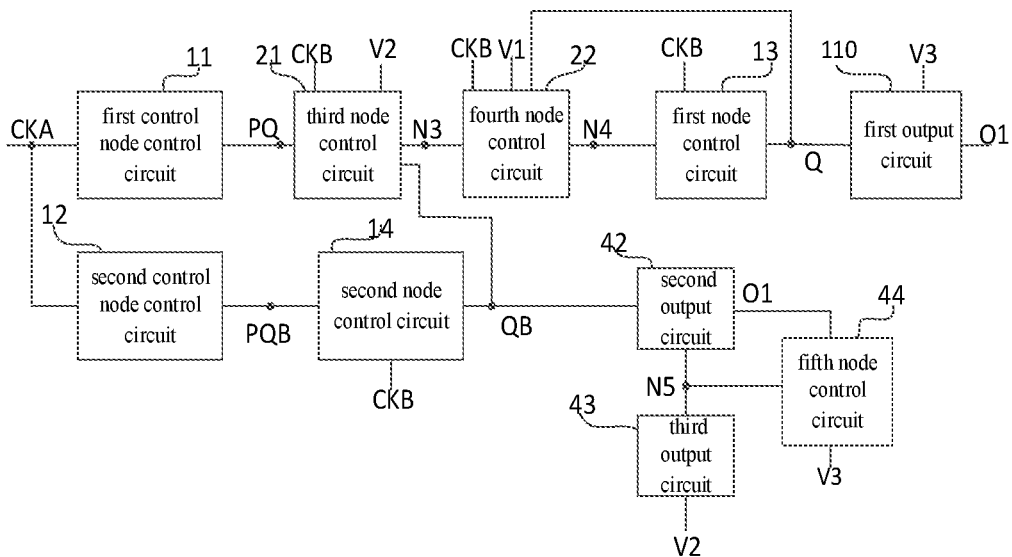
FIG. 6 is a structural diagram of a driving circuit according to at least one embodiment of the present disclosure.

As shown in FIG. 6, on the basis of at least one embodiment of the driving circuit shown in FIG. 4, the driving circuit includes the driving signal output terminal O1, the second output circuit 42, the third output circuit 43 and the fifth node control circuit 44, wherein, The second output circuit 42 is electrically connected to the second node QB, the driving signal output terminal O1 and the fifth node N5, respectively, and is configured to control to connect the driving signal output terminal O1 and the fifth node N5 under the control of the potential of the second node QB;

The third output circuit 43 is electrically connected to the second node QB, the fifth node N5 and the second voltage terminal V2 respectively, and is configured to control to connect the fifth node N5 and the second voltage terminal V2 under the control of the potential of the second node QB;

The fifth node control circuit 44 is electrically connected to the fifth node N5 and the driving signal output terminal O1 respectively, and the fifth node control circuit is also electrically connected to the third voltage terminal V3, is configured to control to connect the fifth node N5 and the third voltage terminal V3 under the control of the driving signal provided by the driving signal output terminal O1.

In at least one embodiment of the present disclosure, the third voltage terminal V3 may be the first high voltage terminal VGH, but not limited thereto.

When at least one embodiment of the driving circuit shown in FIG. 6 of the present disclosure is working, the fifth node control circuit 44 controls to connect the fifth node N5 and the third voltage terminal V3 (the third voltage terminal V3 can be the first high voltage terminal VGH), so as to prevent the potential of the driving signal outputted by the driving signal output terminal O1 from being lowered due to current leakage, so as to output the driving signal normally.

In at least one embodiment of the present disclosure, the first control node control circuit is respectively electrically connected to the first control node, the first clock signal terminal, the second control node and the second voltage terminal, is configured to control to connect the first control node and the second voltage terminal under the control of the first clock signal provided by the first clock signal terminal and the potential of the second control node.

In a specific implementation, the first control node control circuit may control the potential of the first control node under the control of the first clock signal and the potential of the second control node.

Optionally, the first control node control circuit is further electrically connected to the second clock signal terminal and the input terminal, is configured to control to connect the first control node and the input terminal under the control of the second clock signal provided by the second clock signal terminal.

In a specific implementation, the first control node control circuit may also control to connect the first control node and the input terminal under the control of the second clock signal.

Figure 7:
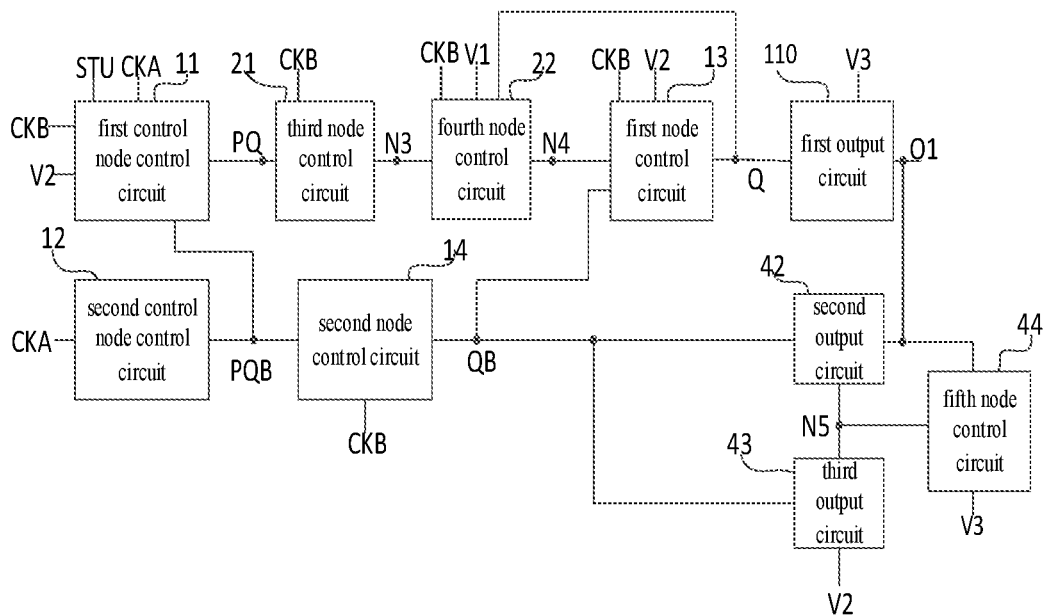
FIG. 7 is a structural diagram of a driving circuit according to at least one embodiment of the present disclosure.

As shown in FIG. 7, on the basis of at least one embodiment of the driving circuit shown in FIG. 5, The first control node control circuit 11 is respectively electrically connected to the first control node PQ, the first clock signal terminal CKB, the second control node PQB and the second voltage terminal V2, and is configured to control to connect the first control node PQ and the second voltage terminal V2 under the control of the first clock signal provided by the first clock signal terminal CKB and the potential of the second control node PQB;

The first control node control circuit 11 is also electrically connected to the second clock signal terminal CKA and the input terminal STU, is configured to control to connect the first control node PQ and the input terminal STU under the control of the second clock signal provided by the second clock signal terminal CKA.

Figure 8:
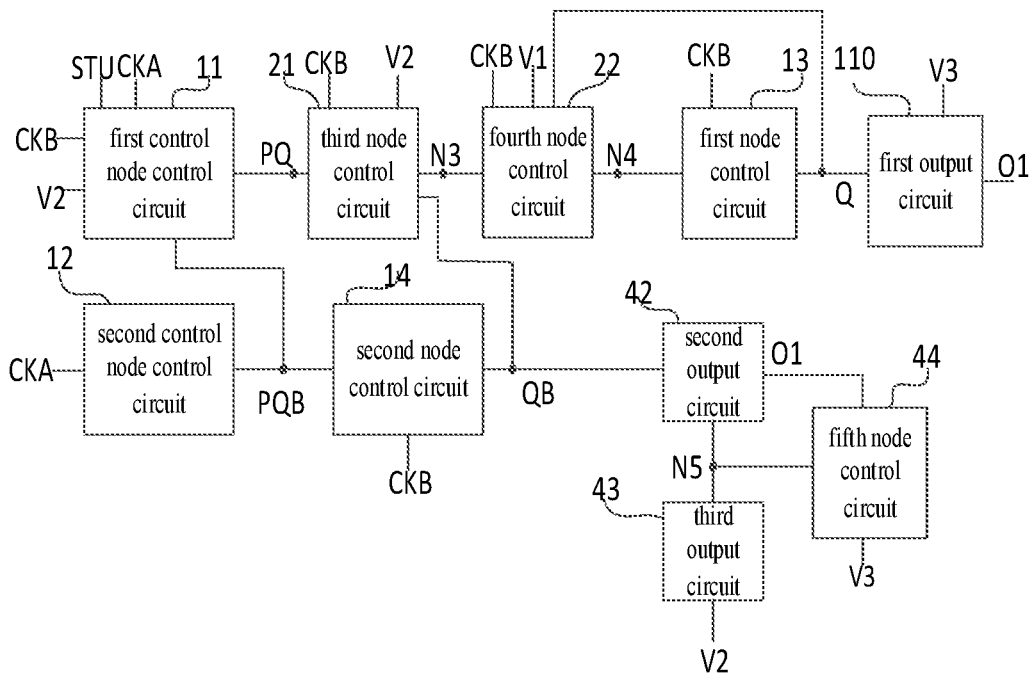
FIG. 8 is a structural diagram of a driving circuit according to at least one embodiment of the present disclosure.

As shown in FIG. 8, on the basis of at least one embodiment of the driving circuit shown in FIG. 6, The first control node control circuit 11 is respectively electrically connected to the first control node PQ, the first clock signal terminal CKB, the second control node PQB and the second voltage terminal V2, and is configured to control to connect the first control node PQ and the second voltage terminal V2 under the control of the first clock signal provided by the first clock signal terminal CKB and the potential of the second control node PQB;

The first control node control circuit 11 is also electrically connected to the second clock signal terminal CKA and the input terminal STU, is configured to control to connect the first control node PQ and the input terminal STU under the control of the second clock signal provided by the second clock signal terminal CKA.

In at least one embodiment of the present disclosure, the second control node control circuit is electrically connected to the second control node, the second clock signal terminal, the reset terminal, the third voltage terminal and the first control node respectively, is configured to control to connect the second control node and the third voltage terminal under the control of the second clock signal provided by the second clock signal terminal, and control to connect the second control node and the third voltage terminal under the control of the reset signal provided by the reset terminal, control to connect the second control node and the second clock signal terminal under the control of the potential of the first control node, and control to connect the second control node and the second clock signal terminal under the control of the potential of the first control node.

In a specific implementation, the second node control circuit can control the potential of the second node under the control of the second clock signal, the reset signal and the potential of the first control node.

Figure 9:
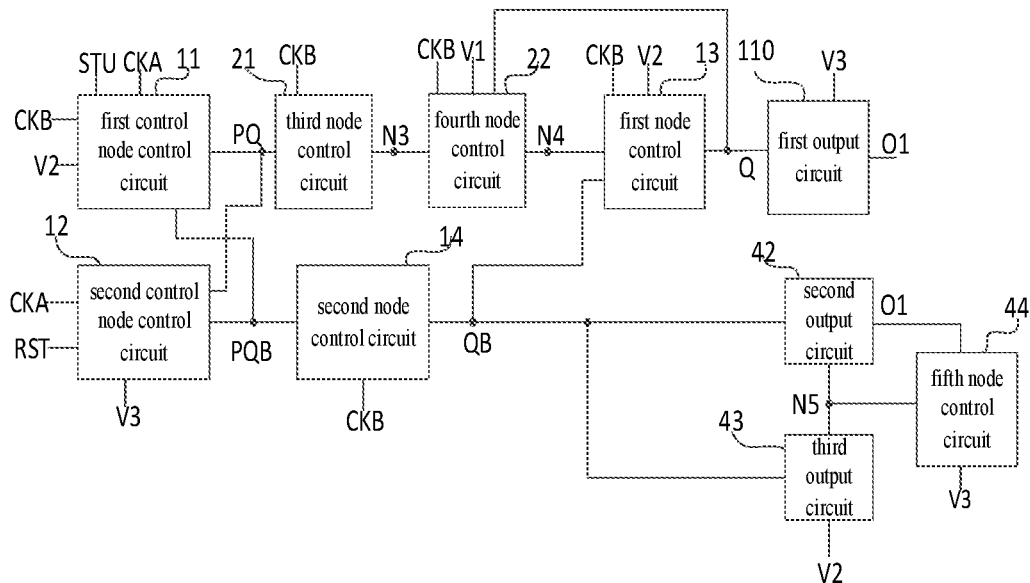
FIG. 9 is a structural diagram of a driving circuit according to at least one embodiment of the present disclosure.

As shown in FIG. 9, on the basis of at least one embodiment of the driving circuit shown in FIG. 7, the second control node control circuit 12 is connected to the second control node PQB, the second clock signal terminal CKA, the reset terminal RST, the third voltage terminal V3 and the first control node PQ, and is configured to control to connect the second control node PQB and the third voltage terminal V3 under the control of the second clock signal provided by the second clock signal terminal CKA, and control to connect the second control node PQB and the third voltage terminal V3 under the control of the reset signal provided by the reset terminal RST, and control to connect the second control node PQB and the second clock signal terminal CKA under the control of the potential of the first control node PQ, and control to connect the second control node PQB and the second clock signal terminal under the control of the potential of the first control node PQ.

Figure 10:
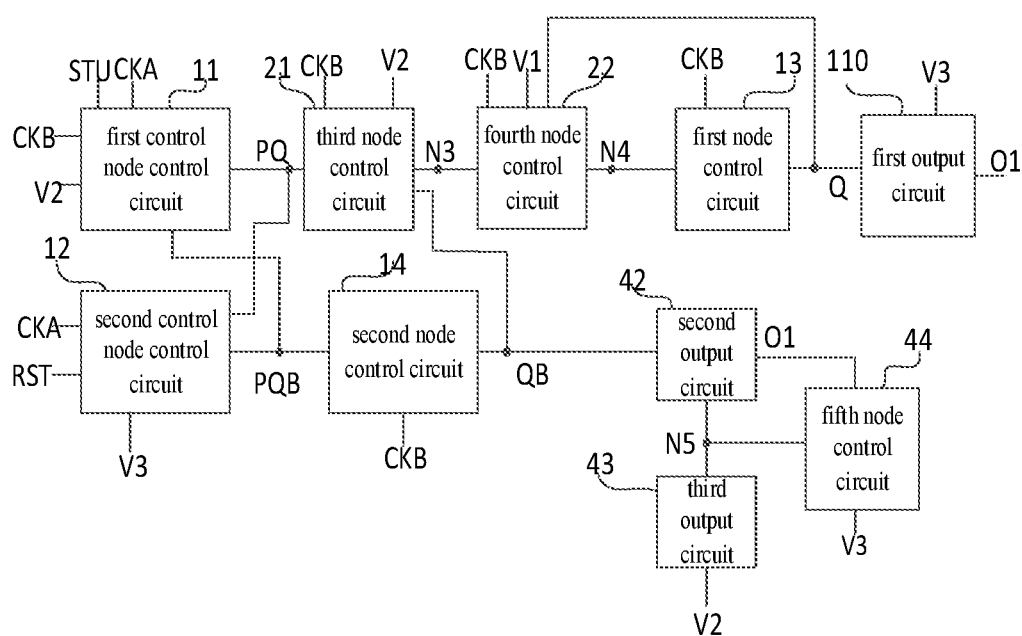
FIG. 10 is a structural diagram of a driving circuit according to at least one embodiment of the present disclosure.

As shown in FIG. 10, on the basis of at least one embodiment of the driving circuit shown in FIG. 8, the second control node control circuit 12 is connected to the second control node PQB, the second clock signal terminal CKA, the reset terminal RST, the third voltage terminal V3 and the first control node PQ, and is configured to control to connect the second control node PQB and the third voltage terminal V3 under the control of the second clock signal provided by the second clock signal terminal CKA, control to connect the second control node PQB and the third voltage terminal V3 under the control of the reset signal provided by the reset terminal RST, and control to connect the second control node PQB and the second clock signal terminal CKA under the control of the potential of the first control node PQ, and control to connect the second control node PQB and the second clock signal terminal CKA under the control of the potential of the first control node PQ.

Optionally, the driving circuit described in at least one embodiment of the present disclosure further includes a first energy storage circuit and a second energy storage circuit;

A first terminal of the first energy storage circuit is electrically connected to the first node, and a second terminal of the first energy storage circuit is electrically connected to the driving signal output terminal; the first energy storage circuit is configured to maintain the potential of the first node;

A first terminal of the second energy storage circuit is electrically connected to the second node, and a second terminal of the second energy storage circuit is electrically connected to the second voltage terminal; the second energy storage circuit is configured to maintain the potential of the second node.

In at least one embodiment of the present disclosure, the first energy storage circuit may include a first capacitor, and the second energy storage circuit may include a second capacitor.

Figure 11:
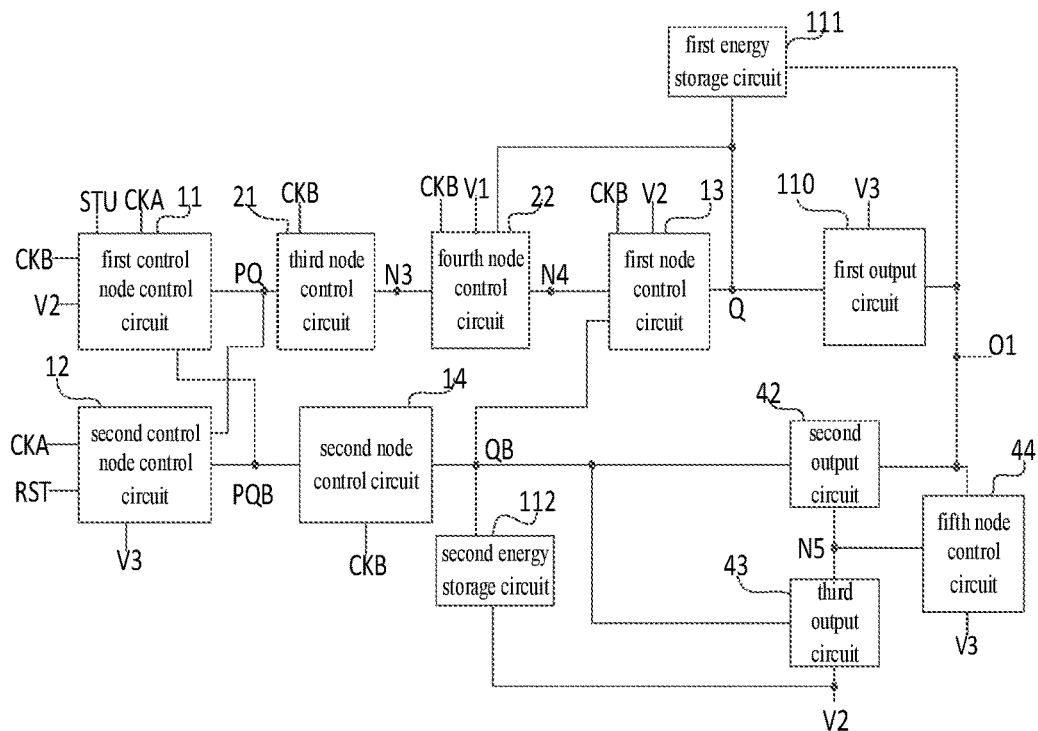
FIG. 11 is a structural diagram of a driving circuit according to at least one embodiment of the present disclosure.

As shown in FIG. 11, on the basis of at least one embodiment of the driving circuit shown in FIG. 9, the driving circuit described in at least one embodiment of the present disclosure further includes a first energy storage circuit 111 and a second energy storage circuit 112;

The first terminal of the first energy storage circuit 111 is electrically connected to the first node Q, and the second terminal of the first energy storage circuit 111 is electrically connected to the driving signal output terminal O1; the first energy storage circuit 111 is used to maintain the potential of the first node Q;

The first terminal of the second energy storage circuit 112 is electrically connected to the second node QB, and the second terminal of the second energy storage circuit 112 is electrically connected to the second voltage terminal V2; the second energy storage circuit 112 is used to maintain the potential of the second node QB.

Figure 12:
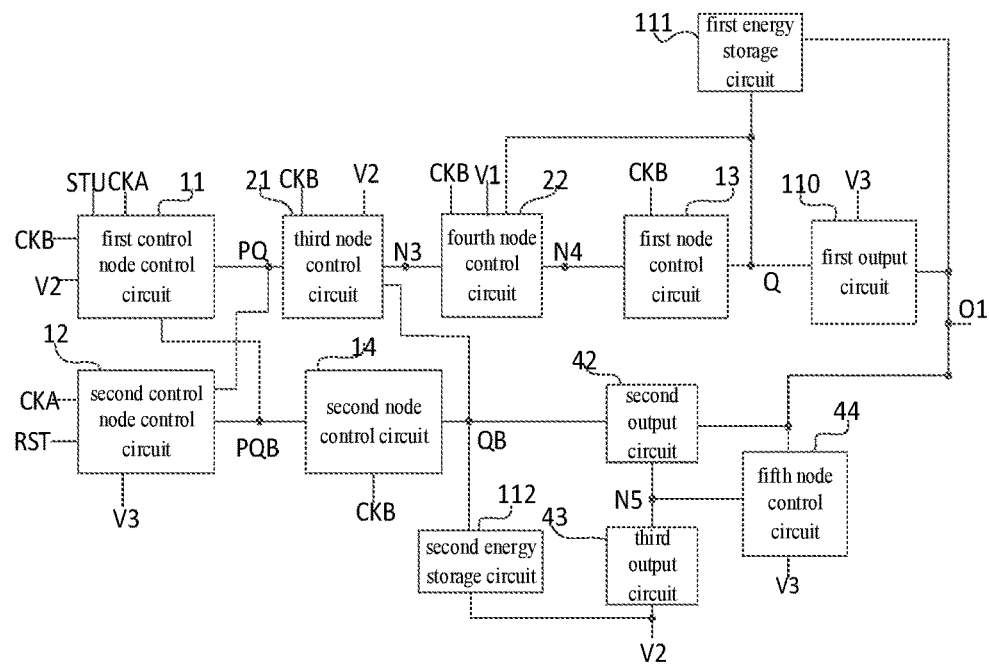
FIG. 12 is a structural diagram of a driving circuit according to at least one embodiment of the present disclosure.

As shown in FIG. 12, on the basis of at least one embodiment of the driving circuit shown in FIG. 10, The first terminal of the first energy storage circuit 111 is electrically connected to the first node Q, and the second terminal of the first energy storage circuit 111 is electrically connected to the driving signal output terminal O1; the first energy storage circuit 111 is used to maintain the potential of the first node Q;

The first terminal of the second energy storage circuit 112 is electrically connected to the second node QB, and the second terminal of the second energy storage circuit 112 is electrically connected to the second voltage terminal V2; the second energy storage circuit 112 is used to maintain the potential of the second node QB.

Optionally, the second node control circuit includes a first transistor;

A gate electrode of the first transistor is electrically connected to the second control node, a first electrode of the first transistor is electrically connected to the first clock signal terminal, and a second electrode of the first transistor is electrically connected to the second node.

Optionally, the fourth node control circuit includes a second transistor and a third transistor;

A gate electrode of the second transistor is electrically connected to the first node, a first electrode of the second transistor is electrically connected to the first voltage terminal, and a second electrode of the second transistor is electrically connected to the fourth node;

A gate electrode of the third transistor is electrically connected to the first clock signal terminal, a first electrode of the third transistor is electrically connected to the third node, and a second electrode of the third transistor is electrically connected to the fourth node.

Optionally, the fifth node control circuit includes a fourth transistor;

A gate electrode of the fourth transistor is electrically connected to the driving signal output terminal, a first electrode of the fourth transistor is electrically connected to the third voltage terminal or the first voltage terminal, and a second electrode of the fourth transistor is electrically connected to the fifth node.

Optionally, the first control node control circuit includes a fifth transistor and a sixth transistor; a gate electrode of the fifth transistor is electrically connected to the first clock signal terminal, and a first electrode of the fifth transistor is connected to the first control node;

A gate electrode of the sixth transistor is electrically connected to the second control node, a first electrode of the sixth transistor is electrically connected to a second electrode of the fifth transistor, and a second electrode of the sixth transistor is electrically connected to the second voltage terminal.

Optionally, the first control node control circuit includes a fifth transistor and a sixth transistor;

A gate electrode of the fifth transistor is electrically connected to the second control node, and a first electrode of the fifth transistor is electrically connected to the first control node;

A gate electrode of the sixth transistor is electrically connected to the first clock signal terminal, a first electrode of the sixth transistor is electrically connected to a second electrode of the fifth transistor, and a second electrode of the sixth transistor is electrically connected to the second voltage terminal.

Optionally, the first control node control circuit includes a seventh transistor; a gate electrode of the seventh transistor is electrically connected to the second clock signal terminal, and a first electrode of the seventh transistor is connected to the input terminal, and a second electrode of the seventh transistor is electrically connected to the first control node.

Optionally, the third node control circuit includes an eighth transistor and a third capacitor; a gate electrode of the eighth transistor is electrically connected to the first control node, and a first electrode of the eighth transistor is connected to the first clock signal terminal, and a second electrode of the eighth transistor is electrically connected to the third node;

A first terminal of the third capacitor is electrically connected to the first control node, and a second terminal of the third capacitor is electrically connected to a third node;

The second node control circuit also includes a fourth capacitor;

A first terminal of the fourth capacitor is electrically connected to the second control node, and a second terminal of the fourth capacitor is electrically connected to the second node.

Optionally, the third node control circuit further includes a ninth transistor;

A gate electrode of the ninth transistor is electrically connected to the second node, a first electrode of the ninth transistor is electrically connected to the third node, and a second electrode of the ninth transistor is electrically connected to the second voltage terminal.

Optionally, the first node control circuit includes a tenth transistor;

A gate electrode of the tenth transistor is electrically connected to the first clock signal terminal, a first electrode of the tenth transistor is electrically connected to the fourth node, a second electrode of the tenth transistor is electrically connected to the first node.

Optionally, the first node control circuit includes an eleventh transistor;

A gate electrode of the eleventh transistor is electrically connected to the second node, a first electrode of the eleventh transistor is electrically connected to the first node, a second electrode of the eleventh transistor is electrically connected to the second voltage terminal.

Optionally, the second control node control circuit includes a twelfth transistor, a thirteenth transistor, and a fourteenth transistor;

A gate electrode of the twelfth transistor is electrically connected to the reset terminal, a first electrode of the twelfth transistor is electrically connected to the second control node, and a second electrode of the twelfth transistor is electrically connected to the third voltage terminal;

A gate electrode of the thirteenth transistor is electrically connected to the second clock signal terminal, a first electrode of the thirteenth transistor is electrically connected to the third voltage terminal, and a second electrode of the thirteenth transistor is electrically connected to the second control node;

A gate electrode of the fourteenth transistor is electrically connected to the first control node, a first electrode of the fourteenth transistor is electrically connected to the second clock signal terminal, and a second electrode of the fourteenth transistor is electrically connected to the second control node.

Optionally, the first output circuit includes a first output transistor; a gate electrode of the first output transistor is electrically connected to the first node, and a first electrode of the first output transistor is connected to a third voltage terminal or an output clock signal terminal, and a second electrode of the first output transistor is electrically connected to the driving signal output terminal.

Optionally, the second output circuit includes a second output transistor, and the third output circuit includes a third output transistor;

A gate electrode of the second output transistor is electrically connected to the second node, a first electrode of the second output transistor is electrically connected to the driving signal output terminal, and a second electrode of the second output transistor is electrically connected to the fifth node;

A gate electrode of the third output transistor is electrically connected to the second node, a first electrode of the third output transistor is electrically connected to the fifth node, and a second electrode of the third output transistor is electrically connected to the second voltage terminal.

Figure 13:
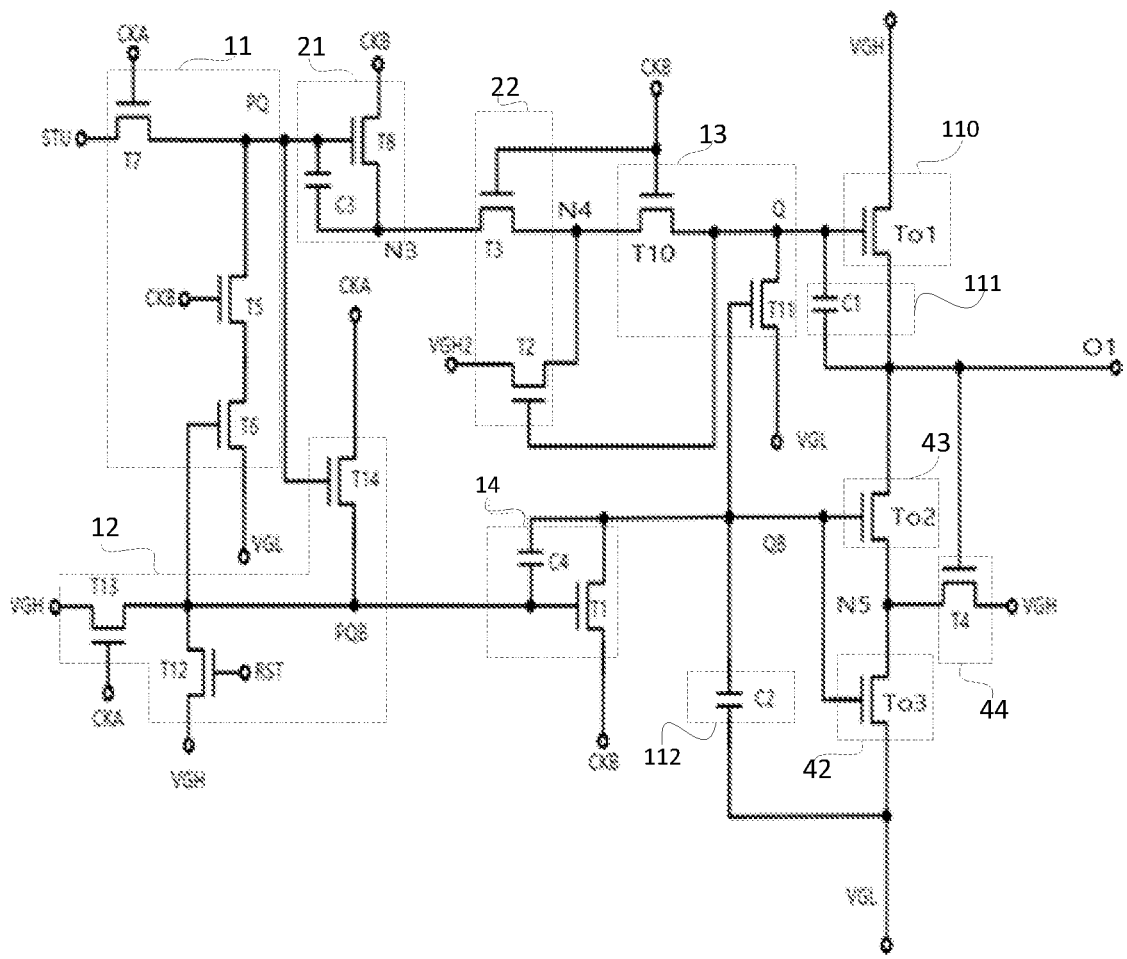
FIG. 13 is a circuit diagram of a driving circuit according to at least one embodiment of the present disclosure.

As shown in FIG. 13, on the basis of at least one embodiment of the driving circuit shown in FIG. 11, the second node control circuit 14 includes a first transistor T1 and a fourth capacitor C4;

The gate electrode of the first transistor T1 is electrically connected to the second control node PQB, the source electrode of the first transistor T1 is electrically connected to the first clock signal terminal CKB, and the drain electrode of the first transistor T1 is electrically connected to the second node QB;

A first terminal of the fourth capacitor C4 is electrically connected to the second control node PQB, and a second terminal of the fourth capacitor C4 is electrically connected to the second node QB;

The fourth node control circuit 22 includes a second transistor T2 and a third transistor T3;

The gate electrode of the second transistor T2 is electrically connected to the first node Q, the source electrode of the second transistor T2 is electrically connected to the second high voltage terminal VGH2, and the drain electrode of the second transistor T2 is electrically connected to the fourth node N4;

The gate electrode of the third transistor T3 is electrically connected to the first clock signal terminal CKB, the source electrode of the third transistor T3 is electrically connected to the third node N3, and the drain electrode of the third transistor T3 is electrically connected to the fourth node N4;

The fifth node control circuit 44 includes a fourth transistor T4;

The gate electrode of the fourth transistor T4 is electrically connected to the driving signal output terminal O1, the source electrode of the fourth transistor T4 is electrically connected to the first high voltage terminal VGH, and the drain electrode of the fourth transistor T4 is electrically connected to the fifth node N5;

The first control node control circuit 11 includes a fifth transistor T5 and a sixth transistor T6;

The gate electrode of the fifth transistor T5 is electrically connected to the first clock signal terminal CKB, and the source electrode of the fifth transistor T5 is electrically connected to the first control node PQ;

The gate electrode of the sixth transistor T6 is electrically connected to the second control node PQB, the source electrode of the sixth transistor T6 is electrically connected to the drain electrode of the fifth transistor T5, and the drain electrode of the sixth transistor T6 is electrically connected to the low voltage terminal VGL;

The first control node control circuit 11 includes a seventh transistor T7;

The gate electrode of the seventh transistor T7 is electrically connected to the second clock signal terminal CKA, the source electrode of the seventh transistor T7 is electrically connected to the input terminal STU, and the drain electrode of the seventh transistor T7 is electrically connected to the first control node PQ;

The third node control circuit 21 includes an eighth transistor T8 and a third capacitor C3;

The gate electrode of the eighth transistor T8 is electrically connected to the first control node PQ, the source electrode of the eighth transistor T8 is electrically connected to the first clock signal terminal CKB, and the drain electrode of the eighth transistor T8 is electrically connected to the third node N3;

A first terminal of the third capacitor C3 is electrically connected to the first control node PQ, and a second terminal of the third capacitor C3 is electrically connected to the third node N3.

The first node control circuit 13 includes a tenth transistor T10;

The gate electrode of the tenth transistor T10 is electrically connected to the first clock signal terminal CKB, the source electrode of the tenth transistor T10 is electrically connected to the fourth node N4, and the drain electrode of the tenth transistor T10 is electrically connected to the first node Q;

The first node control circuit 13 includes an eleventh transistor T11;

The gate electrode of the eleventh transistor T11 is electrically connected to the second node QB, the source electrode of the eleventh transistor T11 is electrically connected to the first node Q, and the drain electrode of the eleventh transistor T11 is electrically connected to the low voltage terminal VGL;

The second control node control circuit 12 includes a twelfth transistor T12, a thirteenth transistor T13 and a fourteenth transistor T14;

The gate electrode of the twelfth transistor T12 is electrically connected to the reset terminal RST, the source electrode of the twelfth transistor T12 is electrically connected to the second control node PQB, and the drain electrode of the twelfth transistor T12 is electrically connected to the first high voltage terminal VGH;

The gate electrode of the thirteenth transistor T13 is electrically connected to the second clock signal terminal CKA, the source electrode of the thirteenth transistor T13 is electrically connected to the first high voltage terminal VGH, and the drain electrode of the thirteenth transistor T13 is electrically connected to the second control node PQB;

The gate electrode of the fourteenth transistor T14 is electrically connected to the first control node PQ, the source electrode of the fourteenth transistor T14 is electrically connected to the second clock signal terminal CKA, and the drain electrode of the fourteenth transistor T14 is electrically connected to the second control node PQB;

The first output circuit 110 includes a first output transistor To1;

The gate electrode of the first output transistor To1 is electrically connected to the first node Q, the source electrode of the first output transistor To1 is electrically connected to the first high voltage terminal VGH, and the drain electrode of the first output transistor To1 is electrically connected to the driving signal output terminal O1;

The second output circuit 42 includes a second output transistor To2, and the third output circuit 43 includes a third output transistor To3;

The gate electrode of the second output transistor To2 is electrically connected to the second node QB, the source electrode of the second output transistor To2 is electrically connected to the driving signal output terminal O1, and the drain electrode of the second output transistor To2 is electrically connected to the fifth node N5;

The gate electrode of the third output transistor To3 is electrically connected to the second node QB, the source electrode of the third output transistor To3 is electrically connected to the fifth node N5, and the drain electrode of the third output transistor To3 is electrically connected to the low voltage terminal VGL;

The first energy storage circuit 111 includes a first capacitor C1, and the second energy storage circuit 112 includes a second capacitor C2;

The first terminal of the first capacitor C1 is electrically connected to the first node Q, and the second terminal of the first capacitor C1 is electrically connected to the driving signal output terminal O1;

A first terminal of the second capacitor C2 is electrically connected to the second node QB, and a second terminal of the second capacitor C2 is electrically connected to the driving signal output terminal O1.

In at least one embodiment of the driving circuit shown in FIG. 13, all transistors are n-type transistors, and all transistors are oxide thin film transistors, but not limited thereto.

In at least one embodiment of the driving circuit shown in FIG. 13, a transistor can also be provided, the gate electrode of the transistor is electrically connected to the first control node PQ, and the first electrode of the transistor can be electrically connected to the first high voltage terminal VGH, the second electrode of the transistor may be electrically connected to the third node N3; but not limited thereto.

In at least one embodiment of the present disclosure, the input terminal STU may be electrically connected to the driving signal output terminal of an adjacent previous stage of driving circuit, or the input terminal may be a high level terminal or a clock signal terminal, but not limited.

In at least one embodiment of the present disclosure, the gate electrode of the third transistor may not be electrically connected to the first clock signal terminal CKB, and the gate electrode of the third transistor may be connected to the first high voltage terminal VGH or the second high voltage terminal VGH2.

In at least one embodiment of the present disclosure, the potential of the second high voltage signal provided by the second high voltage terminal VGH2 may be the same as the potential of the first high voltage signal provided by the first high voltage terminal VGH, or the potential of the second high voltage signal may be slightly higher than that of the first high voltage signal; for example, the potential of the second high voltage signal may be 24V, and the potential of the first high voltage signal may be 20V, but not limited thereto.

In at least one embodiment of the present disclosure, the duty ratio of the first clock signal and the duty ratio of the second clock signal may be 25%, and the first clock signal provided by CKB may be shifted back by half a period than the second clock signal provided by CKA;

But not limited to this.

In at least one embodiment of the driving circuit shown in FIG. 13, the first clock signal is added, and T1 controls to connect the second node QB and the first clock signal terminal CKB under the control of the potential of the second control node PQB, so as to prevent To2 and To3 from being in a positive stress state for a long time, and improve the stability of the driving circuit;

In at least one embodiment of the driving circuit shown in FIGS. 13, T2 and T4 are added for prevention of the current leakage;

When the potential of the first node Q is a high voltage, T2 is turned on to control to connect the fourth node N4 and the second high voltage terminal VGH2, thereby preventing the potential of the first node Q from decreasing due to current leakage, so that O1 can output driving signal normally;

When the driving signal output terminal O1 outputs a high voltage, T4 is turned on to control to connect the fifth node N5 and the first high voltage terminal VGH to prevent the potential of the driving signal outputted by the driving signal output terminal O1 from decreasing due to the current leakage.

At least one embodiment of the driving circuit shown in FIG. 13 is working, when the driving signal output terminal O1 needs to output a high voltage signal, when the threshold voltage of To2 and the threshold voltage of To3 drift negatively, and To2 and To3 are turned on abnormally, when T4 is turned on, the driving signal output terminal O1 can also normally output the driving signal.

At least one embodiment of the driving circuit shown in FIG. 13 of the present disclosure is in operation, if the fourth transistor T4 for preventing the current leakage is not provided, when the threshold voltage of To2 and/or the threshold voltage of To3 drift negatively, T11 and/or T12 are turned on abnormally to cause the output current leakage, and at least one embodiment of the present disclosure adopts the fourth transistor T4 for preventing the current leakage, when O1 outputs a high voltage signal, T4 can be controlled to turned on to control to connect VGH and a middle node between To2 and To3, thereby preventing the voltage value of the signal outputted by O1 from decreasing due to the current leakage.

The driving circuit described in at least one embodiment of the present disclosure can normally output the driving signal when the threshold voltage of the oxide thin film transistor is −2.5V to +4V.

In at least one embodiment of the present disclosure, the transistor included in the driving circuit may be an oxide thin film transistor, and the threshold voltage of the oxide thin film transistor may be greater than or equal to −2.5V and less than or equal to 4V, but not limited thereto.

In at least one embodiment of the driving circuit shown in FIGS. 13, T5 and T6 are added;

When CKB provides a high voltage signal and the potential of PQB is the high voltage, T5 and T6 are turned on to control the potential of PQ to be the low voltage for anti-noise.

Figure 14:
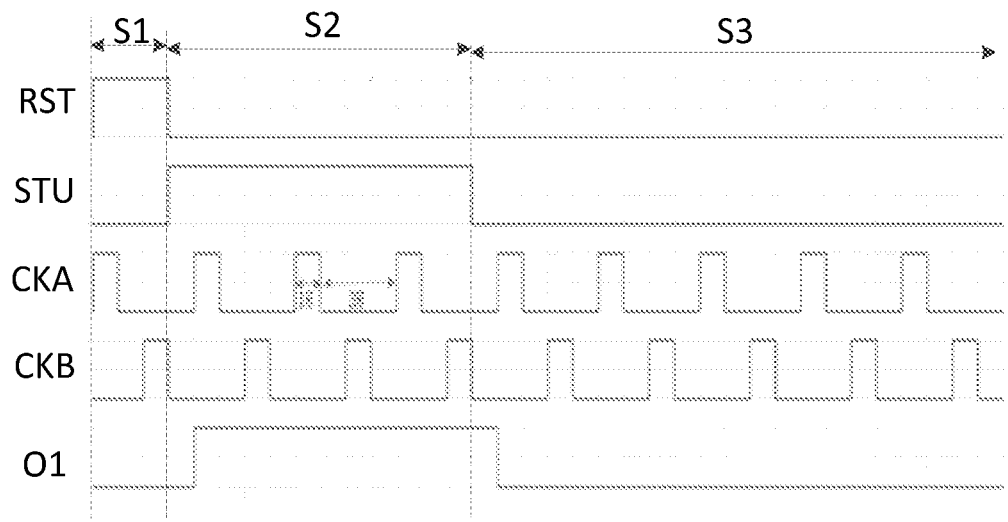
FIG. 14 is a working timing diagram of the driving circuit shown in FIG. 13.

As shown in FIG. 14, when at least one embodiment of the driving circuit described in FIG. 13 of the present disclosure is in operation, the driving period may include a first phase S1, a second phase S2, and a third phase S3 that are set successively;

In the first phase S1, RST provides a high voltage signal, T12 is turned on, when CKA outputs a low voltage signal, and CKB outputs a high voltage signal, the potential of PQB is a high voltage, and T1 is turned on to control to connect QB and CKB, the potential of QB is a high voltage, and T11 is turned on to control the potential of Q to be a low voltage;

In the second phase S2, STU inputs a high voltage signal, when CKA outputs a high voltage signal, and CKB outputs a low voltage signal, T7, T13, To1, and T1 are turned on, the potentials of PQ and PQB are both the high voltage, and T1 is turned on, the potential of QB is the low voltage;

When CKB outputs a high voltage signal and CKA outputs a low voltage signal, due to the action of T8 and C3, the potential of PQ is further bootstrapped and pulled up, T3 and T10 are turned on, the potential of Q is the high voltage, To1 is turned on, and O1 outputs a high voltage signal; in order to avoid the output abnormality caused by the current leakage of the first node Q, T2 is used to prevent the current leakage of the first node Q; at this time, T14 is turned on, PQB and CKA are connected, and the potential of PQB is the low voltage; T1 is turned off, and the potential of QB is maintained at a low voltage under the action of C2;

In the third phase S3, STU inputs a low voltage signal, when CKA outputs a high voltage signal, and CKB outputs a low voltage signal, T7 is turned on, the potential of PQ is the low voltage, T8 and T14 are turned off, T13 is turned on, and the potential of PQB is the high Voltage, T1 is turned on to control the potential of QB to be a low voltage, and the potential of Q is maintained to be a high voltage; O1 outputs a high voltage signal;

When CKB outputs a high voltage signal and CKA outputs a low voltage signal, T1 and T11 are turned on, T1 is turned on, the potential of QB is the high voltage, T11 is turned on, the potential of Q is the low voltage, To2 and To3 are turned on, and O1 outputs a low voltage signal;

Afterwards, the potential of PQB is maintained at a high voltage, and the potential of QB is strongly correlated with the first clock signal provided by CKB, that is, when CKB outputs a high voltage signal, T1 and T11 are turned on, the potential of QB is at a high voltage, and the potential of Q is a low voltage, To2 and To3 are turned off, thereby preventing To2 and To3 from being in a positive stress state for a long time and improving reliability.

When at least one embodiment of the pixel circuit shown in FIG. 13 of the present disclosure is working, the voltage value of the low voltage signal provided by VGL can be −6V. When CKB provides a low voltage signal, the voltage value of the low voltage signal provided by CKB can be −8V. In this way, when the driving signal output terminal O1 outputs a high voltage signal, the above settings can also avoid output current leakage when the threshold voltage of To2 and the threshold voltage of To3 are negatively drifted.

In at least one embodiment of the present disclosure, the difference between the voltage value of the low voltage signal provided by the low voltage terminal VGL and the voltage value of the low voltage signal provided by the first clock signal terminal CKB may be greater than a predetermined voltage value, and the predetermined voltage value can be greater than or equal to 1.5V, for example, the predetermined voltage value can be 2V, but not limited thereto; the above settings can also avoid output current leakage when the threshold voltage of the second output transistor To2 and the threshold voltage of the third output transistor Vo3 are negatively drifted.

In FIG. 14, 1 H is the scanning time for one row, and 3 H is the scanning time of three rows.

Figure 15:
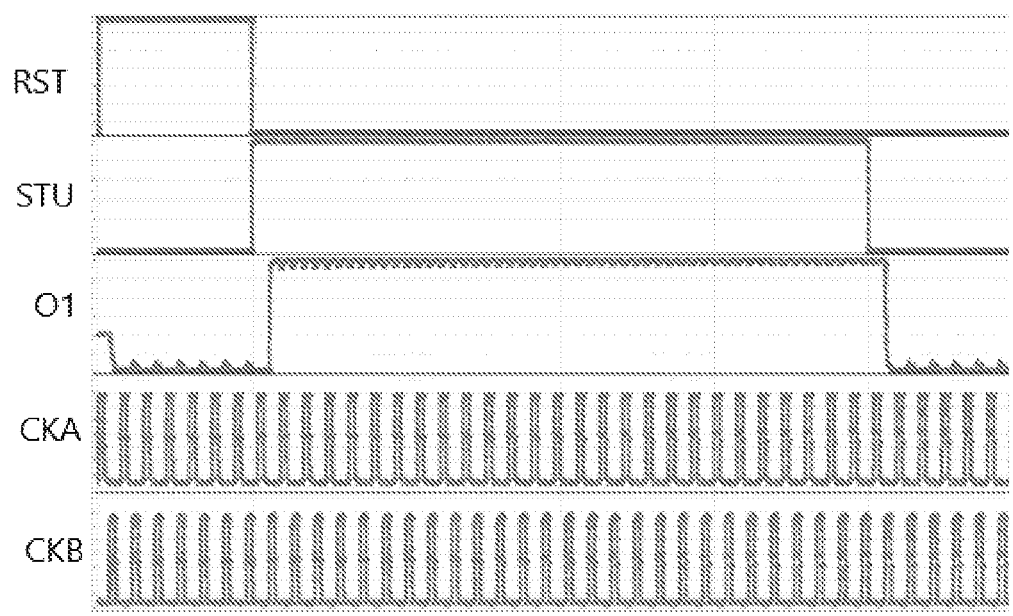
FIG. 15 is a simulation working timing diagram of the driving circuit shown in FIG. 13.

FIG. 15 is a simulation working timing diagram of the pixel circuit shown in FIG. 13.

The driving signal outputted by the pixel circuit described in at least one embodiment of the present disclosure may be a pulse width modulation (PWM) signal, which is made of an oxide transistor, but the threshold voltage of the oxide transistor is easily affected by light, temperature, etc., so that the threshold voltage of the oxide transistor is negatively drifted, which in turn leads to current leakage, and affects the function of the driving circuit. Therefore, at least one embodiment of the present disclosure uses two anti-leakage transistors, so that when the threshold voltage of the oxide transistor is negatively drifted, the driving signal can also be output normally.

Figure 16:
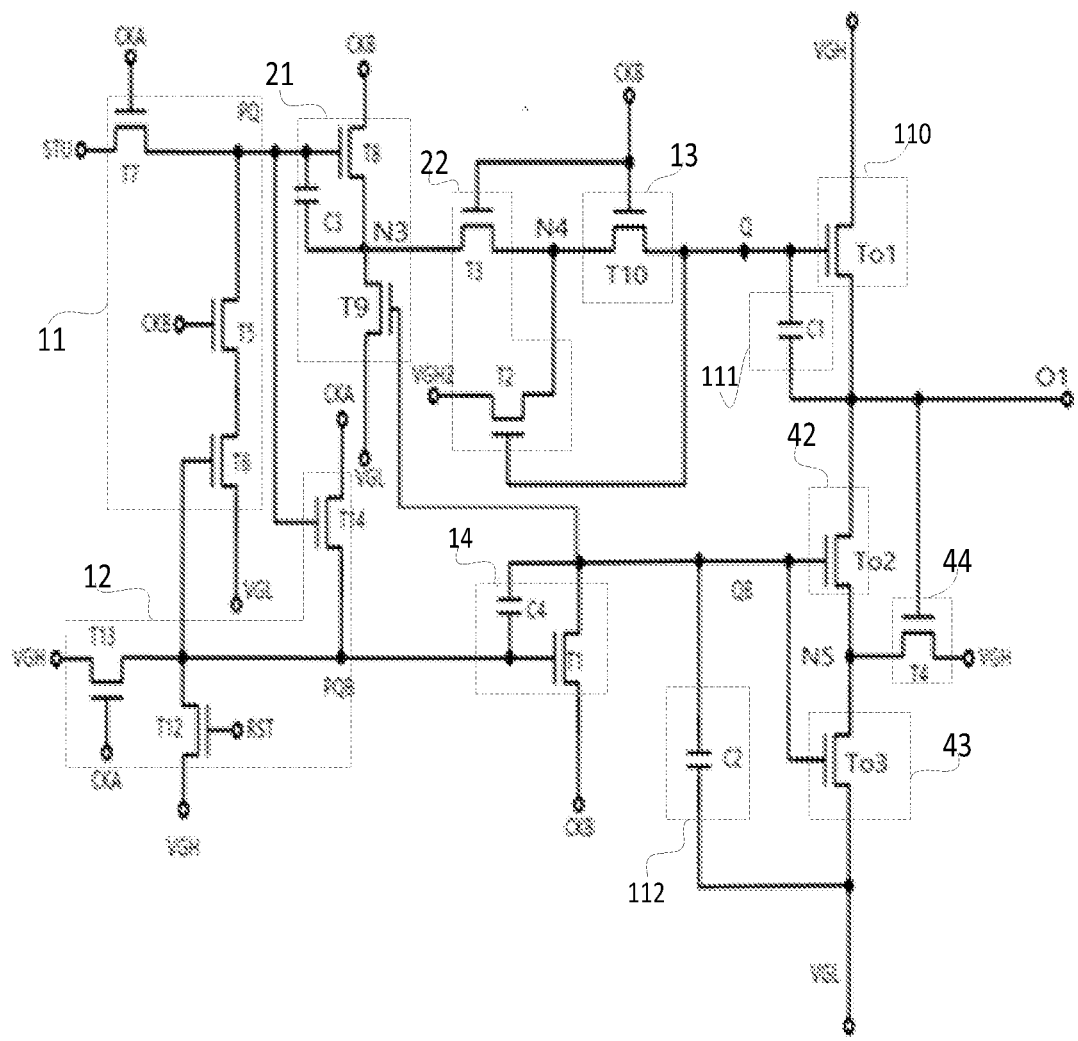
FIG. 16 is a circuit diagram of a driving circuit according to at least one embodiment of the present disclosure.

As shown in FIG. 16, on the basis of at least one embodiment of the driving circuit shown in FIG. 12, the second node control circuit 14 includes a first transistor T1 and a fourth capacitor C4;

The gate electrode of the first transistor T1 is electrically connected to the second control node PQB, the source electrode of the first transistor T1 is electrically connected to the first clock signal terminal CKB, and the drain electrode of the first transistor T1 is electrically connected to the second node QB;

A first terminal of the fourth capacitor C4 is electrically connected to the second control node PQB, and a second terminal of the fourth capacitor C4 is electrically connected to the second node QB;

The fourth node control circuit 22 includes a second transistor T2 and a third transistor T3;

The gate electrode of the second transistor T2 is electrically connected to the first node Q, the source electrode of the second transistor T2 is electrically connected to the second high voltage terminal VGH2, and the drain electrode of the second transistor T2 is electrically connected to the fourth node N4;

The gate electrode of the third transistor T3 is electrically connected to the first clock signal terminal CKB, the source electrode of the third transistor T3 is electrically connected to the third node N3, and the drain electrode of the third transistor T3 is electrically connected to the fourth node N4;

The fifth node control circuit 44 includes a fourth transistor T4;

The gate electrode of the fourth transistor T4 is electrically connected to the driving signal output terminal O1, the source electrode of the fourth transistor T4 is electrically connected to the first high voltage terminal VGH, and the drain electrode of the fourth transistor T4 is electrically connected to the fifth node N5;

The first control node control circuit 11 includes a fifth transistor T5 and a sixth transistor T6;

The gate electrode of the fifth transistor T5 is electrically connected to the first clock signal terminal CKB, and the source electrode of the fifth transistor T5 is electrically connected to the first control node PQ;

The gate electrode of the sixth transistor T6 is electrically connected to the second control node PQB, the source electrode of the sixth transistor T6 is electrically connected to the drain electrode of the fifth transistor T5, and the drain electrode of the sixth transistor T6 is electrically connected to the low voltage terminal VGL;

The first control node control circuit 11 includes a seventh transistor T7;

The gate electrode of the seventh transistor T7 is electrically connected to the second clock signal terminal CKA, the source electrode of the seventh transistor T7 is electrically connected to the input terminal STU, and the drain electrode of the seventh transistor T7 is electrically connected to the first control node PQ;

The third node control circuit 21 includes an eighth transistor T8, a third capacitor C3 and a ninth transistor T9;

The gate electrode of the eighth transistor T8 is electrically connected to the first control node PQ, the source electrode of the eighth transistor T8 is electrically connected to the first clock signal terminal CKB, and the drain electrode of the eighth transistor T8 is electrically connected to the third node N3;

The first terminal of the third capacitor C3 is electrically connected to the first control node PQ, and the second terminal of the third capacitor C3 is electrically connected to the third node N3;

The gate electrode of the ninth transistor T9 is electrically connected to the second node QB, the source electrode of the ninth transistor T9 is electrically connected to the third node N3, and the drain electrode of the ninth transistor T9 is connected to the low voltage terminal VGL;

The first node control circuit 13 includes a tenth transistor T10;

The gate electrode of the tenth transistor T10 is electrically connected to the first clock signal terminal CKB, the source electrode of the tenth transistor T10 is electrically connected to the fourth node N4, and the drain electrode of the tenth transistor T10 is electrically connected to the first node Q;

The second control node control circuit 12 includes a twelfth transistor T12, a thirteenth transistor T13 and a fourteenth transistor T14;

The gate electrode of the twelfth transistor T12 is electrically connected to the reset terminal RST, the source electrode of the twelfth transistor T12 is electrically connected to the second control node PQB, and the drain electrode of the twelfth transistor T12 is electrically connected to the first high voltage terminal VGH;

The gate electrode of the thirteenth transistor T13 is electrically connected to the second clock signal terminal CKA, the source electrode of the thirteenth transistor T13 is electrically connected to the first high voltage terminal VGH, and the drain electrode of the thirteenth transistor T13 is electrically connected to the second control node PQB;

The gate electrode of the fourteenth transistor is electrically connected to the first control node, the first electrode of the fourteenth transistor is electrically connected to the second clock signal terminal, and the second electrode of the fourteenth transistor is electrically connected to the second control node;

The first output circuit 110 includes a first output transistor To1;

The gate electrode of the first output transistor To1 is electrically connected to the first node Q, the source electrode of the first output transistor To1 is electrically connected to the first high voltage terminal VGH, and the drain electrode of the first output transistor To1 is electrically connected to the driving signal output terminal O1;

The second output circuit 42 includes a second output transistor To2, and the third output circuit 43 includes a third output transistor To3;

The gate electrode of the second output transistor To2 is electrically connected to the second node QB, the source electrode of the second output transistor To2 is electrically connected to the driving signal output terminal O1, and the drain electrode of the second output transistor To2 is electrically connected to the fifth node N5;

The gate electrode of the third output transistor To3 is electrically connected to the second node QB, the source electrode of the third output transistor To3 is electrically connected to the fifth node N5, and the drain electrode of the third output transistor To3 is electrically connected to the low voltage terminal VGL;

The first energy storage circuit 111 includes a first capacitor C1, and the second energy storage circuit 112 includes a second capacitor C2;

The first terminal of the first capacitor C1 is electrically connected to the first node Q, and the second terminal of the first capacitor C1 is electrically connected to the driving signal output terminal O1;

A first terminal of the second capacitor C2 is electrically connected to the second node QB, and a second terminal of the second capacitor C2 is electrically connected to the driving signal output terminal O1.

In at least one embodiment of the driving circuit shown in FIG. 16, all transistors are n-type transistors, and all transistors are oxide thin film transistors, but not limited thereto.

The difference between at least one embodiment of the driving circuit shown in FIG. 16 of the present disclosure and at least one embodiment of the driving circuit shown in FIG. 13 of the present disclosure is that the transistor for pulling down the potential of the first node Q is moved to be electrically connected to the third node N3, that is, the gate electrode of the ninth transistor T9 is electrically connected to the second node QB, the source electrode of the ninth transistor T9 is electrically connected to the third node N3, and the drain electrode of the ninth transistor T9 is electrically connected to the low voltage terminal VGL, and since the source electrode of T9 is not directly electrically connected to the first node Q, the first node Q can be further prevented from the current leakage.

In at least one embodiment of the driving circuit shown in FIG. 16, the source electrode of the first output transistor To1 is electrically connected to the first high voltage terminal VGH, and the source electrode of the thirteenth transistor T13 is electrically connected to the first high voltage terminal VGH, the drain electrode of the third output transistor To3 is electrically connected to the low voltage terminal VGL;

The source electrode of the first output transistor To1 and the source electrode of the thirteenth transistor T13 are electrically connected to the same input terminal, and the source electrode of the first output transistor To1 and the drain electrode of the third output transistor To3 are connected to different input terminals.

In at least one embodiment of the driving circuit shown in FIG. 16, the driving circuit may only include To2 or To3 for output reset.

In at least one embodiment of the driving circuit shown in FIG. 16, an eleventh transistor T11 may also be provided, the gate electrode of the eleventh transistor T11 is electrically connected to the second node QB, and the source electrode of the eleventh transistor T11 is electrically connected to the first node Q, and the drain electrode of the eleventh transistor T11 is electrically connected to the low voltage terminal VGL;

That is, in at least one embodiment of the present disclosure, the driving circuit may include both a ninth transistor T9 and an eleventh transistor T11;

The ninth transistor T9 resets the potential of N3 under the control of the potential of the second node QB;

The eleventh transistor T11 resets the potential of the first node Q under the control of the second node QB.

Figure 17:
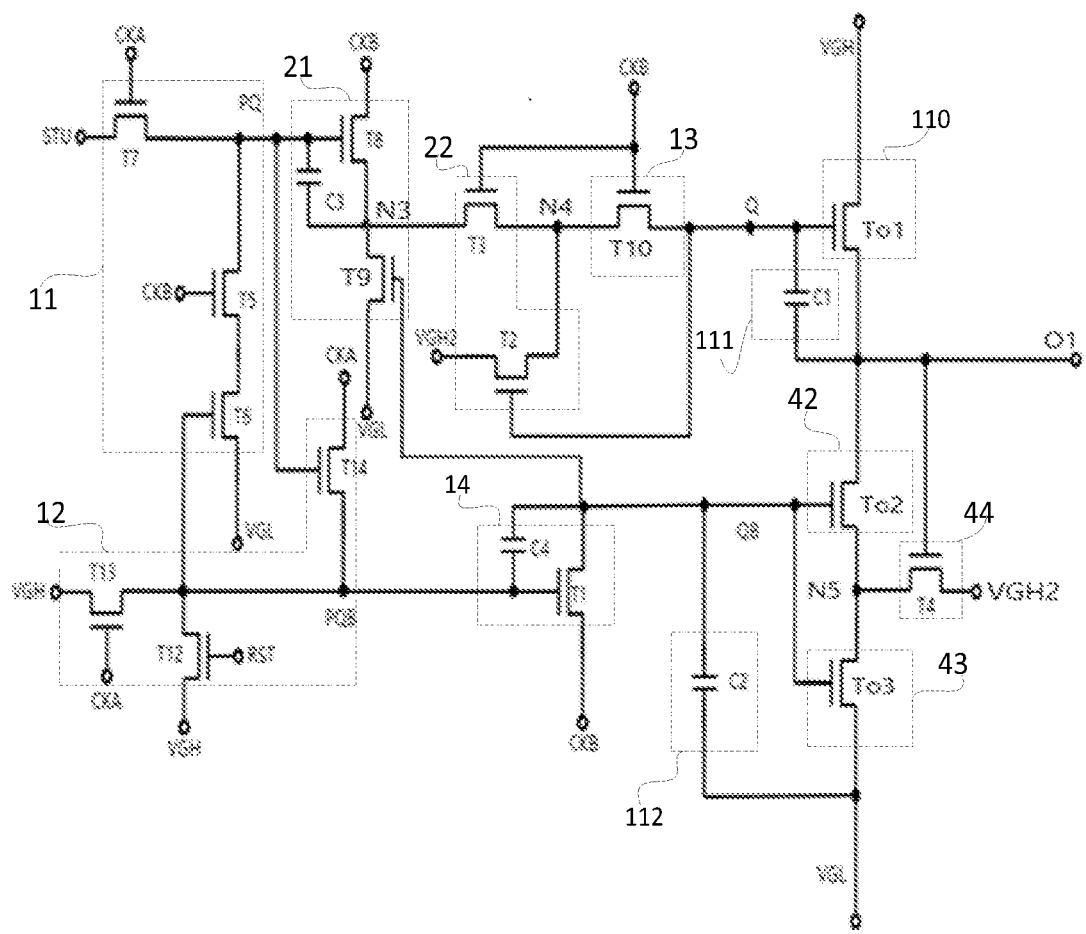
FIG. 17 is a circuit diagram of a driving circuit according to at least one embodiment of the present disclosure.

The difference between at least one embodiment of the driving circuit shown in FIG. 17 of the present disclosure and the driving circuit shown in FIG. 16 of the present disclosure is that the source electrode of T4 is electrically connected to the second high voltage terminal VGH2.

Figure 18:
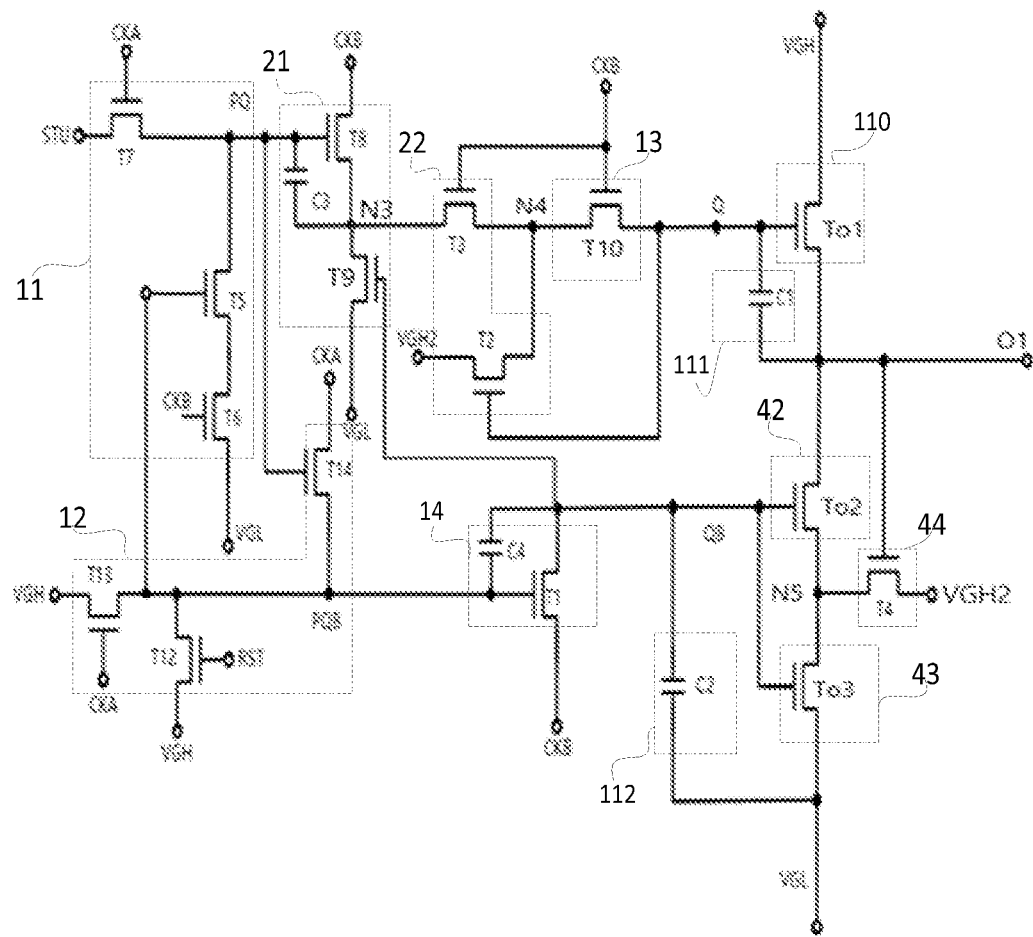
FIG. 18 is a circuit diagram of a driving circuit according to at least one embodiment of the present disclosure.

The difference between at least one embodiment of the driving circuit shown in FIG. 18 of the present disclosure and the driving circuit shown in FIG. 16 of the present disclosure is that the gate electrode of T5 is electrically connected to the second control node PQB, and the gate electrode of T6 is connected to the first clock signal terminal CKB.

Figure 19:
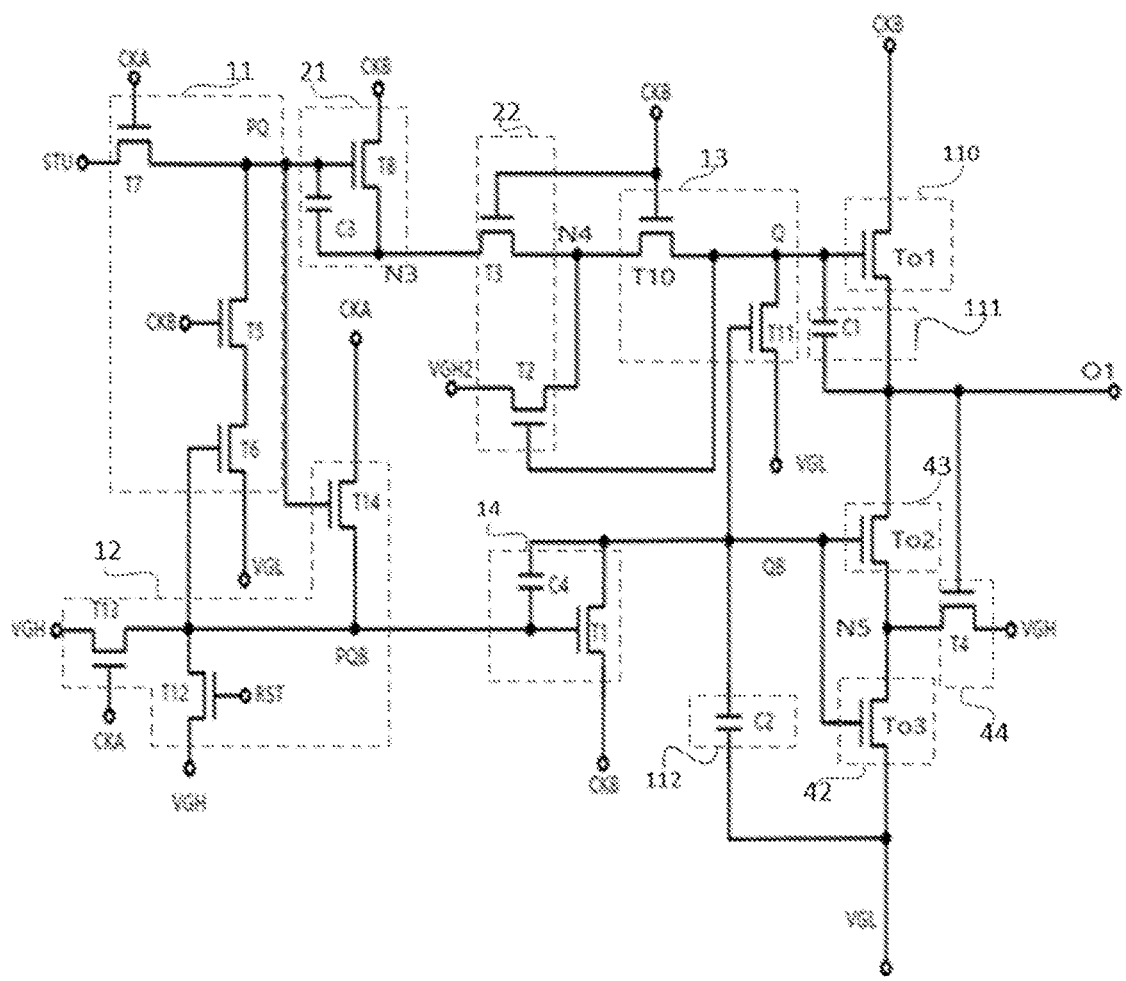
FIG. 19 is a circuit diagram of a driving circuit according to at least one embodiment of the present disclosure.

The difference between at least one embodiment of the driving circuit shown in FIG. 19 of the present disclosure and the driving circuit shown in FIG. 16 of the present disclosure is that the source electrode of To1 is electrically connected to the first clock signal terminal CKB.

Figure 20:
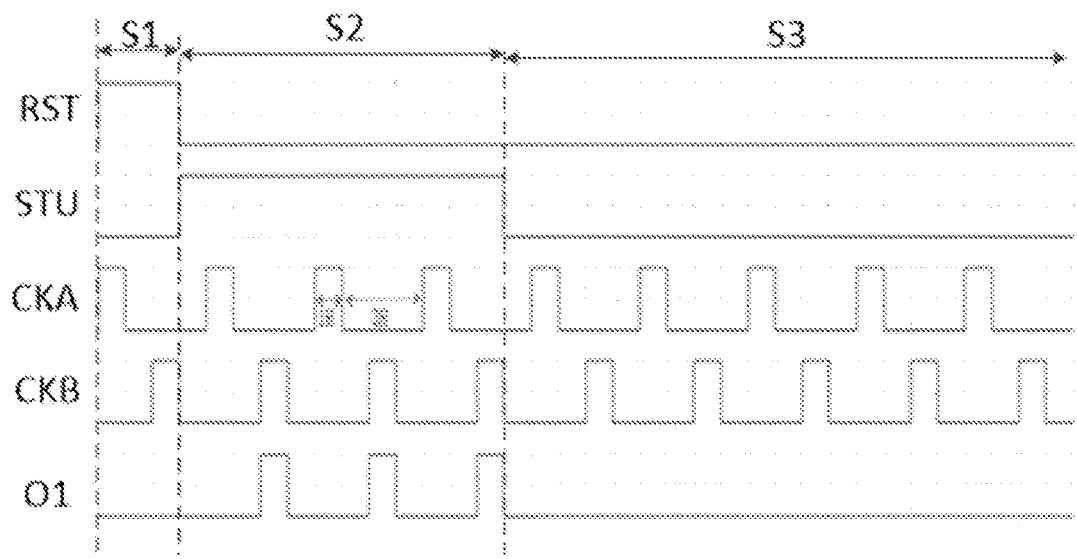
FIG. 20 is a working timing diagram of the driving circuit shown in FIG. 19.

FIG. 20 is a working timing diagram of the driving circuit shown in FIG. 19.

At least one embodiment of the driving circuit shown in FIG. 19 of the present disclosure can be used to provide a gate driving signal for the pixel circuit, but not limited thereto.

The driving signal provided by the driving circuit in at least one embodiment of the present disclosure can provide a control signal for the pixel circuit.

Figure 21:
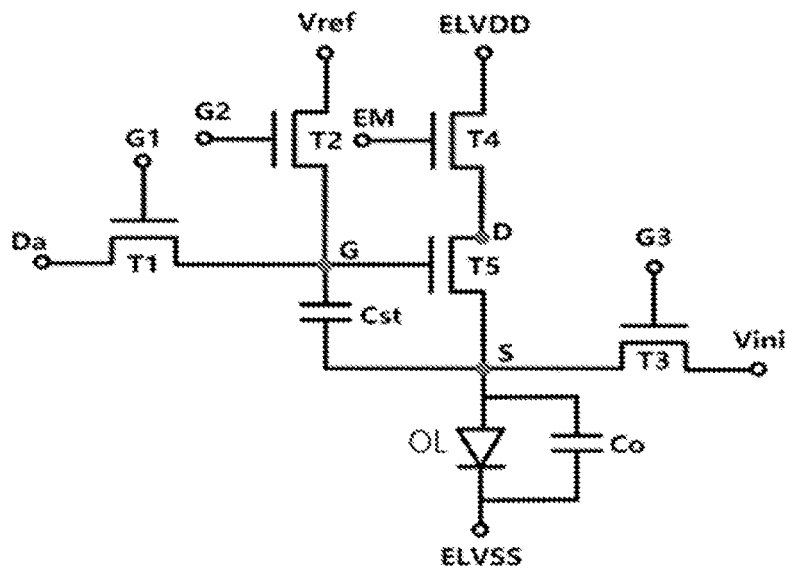
FIG. 21 is a circuit diagram of a related internal compensation pixel circuit.

As shown in FIG. 21, the related internal compensation pixel circuit may include a first control transistor M1, a second control transistor M2, a third control transistor M3, a fourth control transistor M4, a driving transistor M5, a storage capacitor Cst and an organic light emitting diode OL;

M1 is a data writing-in transistor, configured to control to write the data voltage Vdata;

M2 is a compensation control transistor, configured to control the compensation process and write the compensation voltage Vref;

M3 is a reset transistor, configured to write the initialization voltage Vini into the source electrode S of the driving transistor M5;

M4 is a light emitting control transistor, configured to control the light emitting process;

M5 is a driving transistor, configured to drive the OL to emit light;

The one labeled G is the gate electrode of M5, and the one labeled D is the drain electrode of M5.

In at least one embodiment of the present disclosure, when the first output circuit is electrically connected to the third voltage terminal, the driving circuit is configured to provide a light emitting control signal for the gate electrode of the light emitting control transistor included in the internal compensation pixel circuit;

When the first output circuit is electrically connected to the output clock signal terminal, the driving circuit can be configured to provide a gate driving signal for the gate electrode of the data writing-in transistor;

But not limited to this.

In FIG. 21, the first scanning line is labeled G1, the second scanning line is labeled G2, the third scanning line is labeled G3, the light emitting control line is labeled EM, and the power supply voltage terminal is labeled ELVDD, ELVSS is the low level terminal, the one labeled Da is the data line, and the one labeled Co is the capacitor across both terminals of OL.

In at least one embodiment of the pixel circuit shown in FIGS. 21, M1, M2, M3, M4 and M5 are all n-type transistors, and M1, M2, M3, M4 and M5 are all oxide transistors, but this is not limited.

Figure 22:
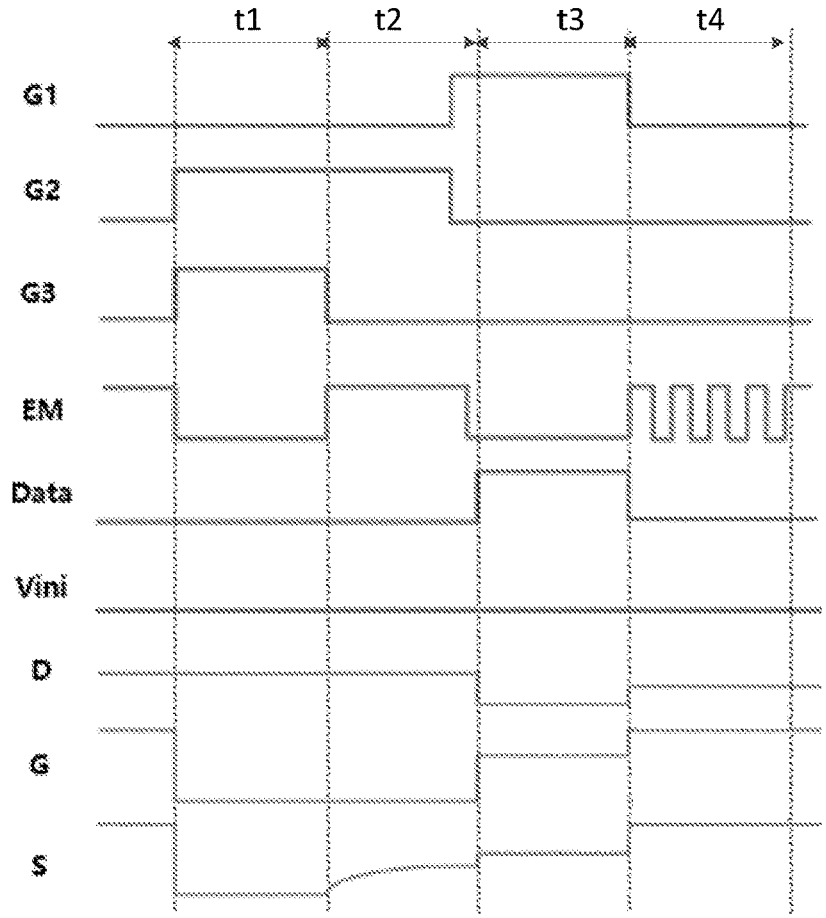
FIG. 22 is a working timing diagram of the internal compensation pixel circuit shown in FIG. 21.

As shown in FIG. 22, when at least one embodiment of the pixel circuit shown in FIG. 21 is in operation, the display period may include a reset phase t1, a compensation phase t2, a data writing-in phase t3, and a light emitting phase t4 which are set successively;

In the reset phase t1, G2 is turned on, M2 is turned on, and Vref is written into the gate electrode G of M5; at the same time, G3 is turned on, and the potential of the source electrode S of M5 is reset to Vini, so that M5 can be turned on when the compensation phase t2 starts;

In the compensation phase t2, G2 remains to be turned on, the voltage of the gate electrode G of M5 is maintained at Vref, T3 is turned off, EM is turned on, and M4 is turned on;

At the beginning of the compensation phase t2, M5 is turned on, and the power supply voltage provided by ELVDD charges Cst to increase the potential of the source electrode S of M5 until the gate-source voltage of M5 is Vth, and at this time, the potential of the source electrode S of M5 is Vref−Vth, Vth is the threshold voltage of M5;

In the data writing-in phase t3, G2, G3 and EM are turned off, and G1 is turned on, so as to write the data voltage Vdata on the data line Da into the gate electrode G of M5;

In the light emitting phase t4, G1, G2, and G3 are all turned off, EM is turned on, M4 and M5 are turned on, and the source electrode S of M5 is charged to Voled (Voled is the turn-on voltage of OL), to drive OL to emit light; when the display panel has a high requirement for the low gray scale display, the PWM dimming mode can be used to improve the low-gray-scale display effect.

Figure 23:
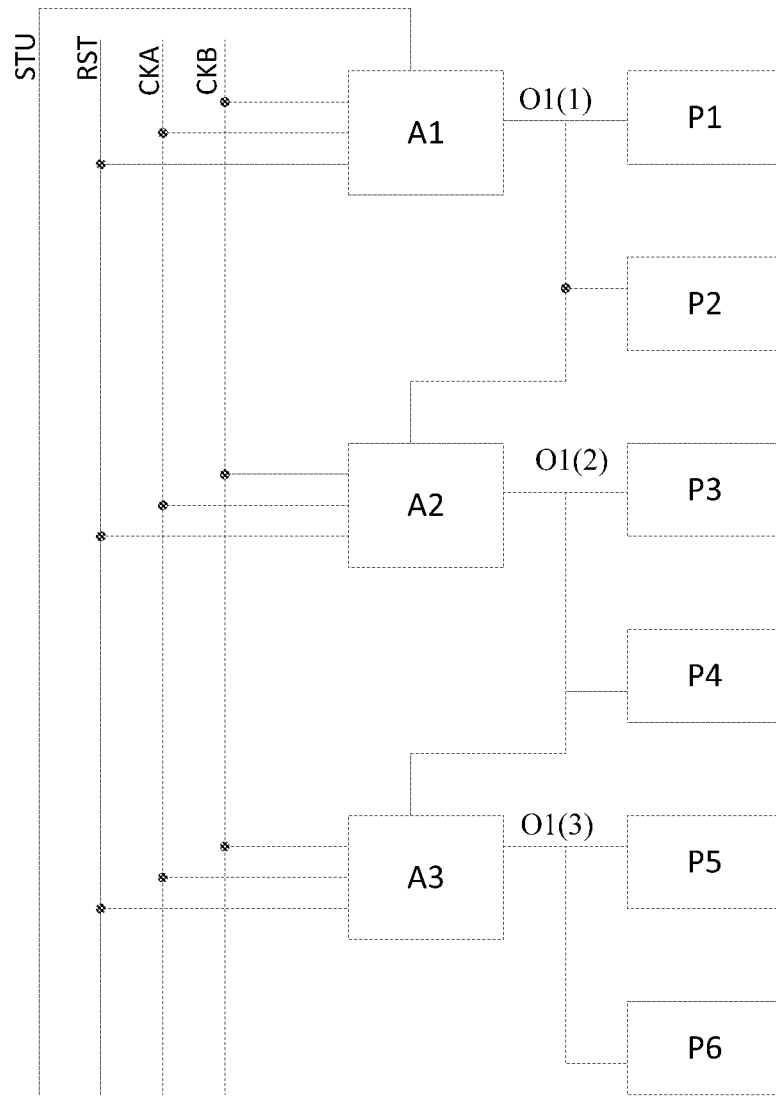
FIG. 23 is a schematic diagram of cascaded three stages of driving circuits.

As shown in FIG. 23, the one labeled A1 is the first stage of driving circuit, the one labeled A2 is the second stage of driving circuit, and the one labeled A3 is the third stage of driving circuit;

Each stage of driving circuit can drive two rows of pixel circuits;

The one labeled P1 is the first row of pixel circuits, the one labeled P2 is the second row of pixel circuits, the one labeled P3 is the third row of pixel circuits, the one labeled P4 is the fourth row of pixel circuits, and the one labeled P5 is the fifth row of pixel circuits, the one labeled P6 is the sixth row of pixel circuits;

The driving signal output terminal O1 (1) of A1 is electrically connected to the input terminal of A2;

The driving signal output terminal O1(2) of A2 is electrically connected to the input terminal of A3; the driving signal output terminal of A3 is labeled O1(3).

In at least one embodiment of the present disclosure, the reset terminal of each stage of driving circuits may also be electrically connected to the driving signal output terminal of the adjacent next stage or several stages of driving circuits, but not limited thereto.

The driving method described in the embodiment of the present disclosure is applied to the above-mentioned driving circuit, and the display period includes a first phase, a second phase and a third phase set successively; the driving method includes:

In at least part of time period included in the first phase, controlling, by the second control node control circuit, a potential of the second control node to be a turn-on voltage; controlling, by the second node control circuit, to connect the second node and the first clock signal terminal under the control of the potential of the second control node; controlling, by the first node control circuit, the potential of the first node to be a turn-off voltage;

In a part of time period included in the second phase, controlling, by the first control node control circuit, the potential of the first control node to be the turn-on voltage; controlling, by the second control node control circuit, the potential of the second control node to be the turn-on voltage, and controlling, by the second node control circuit, to connect the second node and the first clock signal terminal under the control of the potential of the second control node;

In another part of time period included in the second phase, controlling, by the first control node control circuit, the potential of the first control node to be the turn-on voltage, controlling, by the second control node control circuit, the potential of the second control node to be the turn-off voltage, and controlling, by the second node control circuit, the potential of the second node to be the turn-off voltage, and controlling, by the first node control circuit, the potential of the first node to be the turn-on voltage;

In a part of time period included in the third phase, controlling, by the first control node control circuit, the potential of the first control node to be the turn-off voltage, controlling, by the second control node control circuit, the potential of the second control node to be the turn-on voltage, and controlling, by the second node control circuit, to connect the second node and the first clock signal terminal under the control of the potential of the second control node, and controlling, by the first node control circuit, the potential of the first node to be the turn-on voltage;

In another part of time period included in the third phase, controlling, by the second control node control circuit, the potential of the second control node to be the turn-on voltage, controlling, by the first node control circuit, the potential of the first node to be the turn-off voltage, and controlling, by the second node control circuit to connect the second node and the first clock signal terminal under the control of the potential of the second control node.

The display device described in the embodiment of the present disclosure includes the driving circuit.

The display device provided by the embodiments of the present disclosure may be any product or component with a display function, such as a mobile phone, a tablet computer, a television, a monitor, a notebook computer, a digital photo frame, a navigator, and the like.

The above descriptions are implementations of the present disclosure. It should be pointed out that those skilled in the art can make some improvements and modifications without departing from the principle of the present disclosure. These improvements and modifications shall also fall within the scope of the present disclosure.

What is claimed is:

1. A driving circuit, comprising a first control node control circuit, a second control node control circuit, a first node control circuit and a second node control circuit,
    wherein the first control node control circuit is configured to control a potential of a first control node;
    wherein the second control node control circuit is configured to control a potential of a second control node;
    wherein the first node control circuit is configured to control a potential of a first node;
    wherein the second node control circuit is electrically connected to the second control node, a first clock signal terminal and a second node respectively, and is configured to control to connect the first clock signal terminal and the second node under the control of the potential of the second control node;
    wherein the driving circuit further includes a third node control circuit and a fourth node control circuit;
    wherein the third node control circuit is electrically connected to the first control node, a third node and the first clock signal terminal respectively, and is configured to control to connect the third node and the first clock signal terminal under the control of the potential of the first control node, and control a potential of the third node according to the potential of the first control node;
    wherein the fourth node control circuit is configured to control to connect the third node and a fourth node under the control of a first clock signal provided by the first clock signal terminal, control to connect the fourth node and a first voltage terminal under the control of the potential of the first node; and
    wherein the second node control circuit is further configured to control the potential of the second node according to the potential of the second control node.

2. The driving circuit according to claim 1, wherein the first node control circuit is electrically connected to the first node, the first clock signal terminal and the fourth node, and is configured to control to connect the fourth node and the first node under the control of the first clock signal.

3. The driving circuit according to claim 2, wherein the first node control circuit is also electrically connected to the second node and the second voltage terminal, and is configured to control to connect the first node and the second voltage terminal under the control of the potential of the second node.

4. The driving circuit according to claim 1, wherein the third node control circuit is also be electrically connected to the second node and a second voltage terminal, is configured to control to connect the third node and the second voltage terminal under the control of the potential of the second node.

5. The driving circuit according to claim 1, further comprising a driving signal output terminal, a second output circuit, a third output circuit and a fifth node control circuit, wherein,
    the second output circuit is electrically connected to the second node, the driving signal output terminal and the fifth node, and is configured to control to connect the driving signal output terminal and the fifth node under the control of the potential of the second node;

the third output circuit is electrically connected to the second node, the fifth node, and a second voltage terminal, and is configured to control to connect the fifth node and the second voltage terminal under the control of the potential of the second node;

the fifth node control circuit is electrically connected to the fifth node and the driving signal output terminal, and the fifth node control circuit is also electrically connected to a third voltage terminal or the first voltage terminal, and is configured to control to connect the fifth node and the third voltage terminal or the first voltage terminal under the control of a driving signal provided by the driving signal output terminal.

6. The driving circuit according to claim 1, wherein the second control node control circuit is electrically connected to the second control node, a second clock signal terminal, a reset terminal, a third voltage terminal and the first control node respectively, is configured to control to connect the second control node and the third voltage terminal under the control of a second clock signal provided by the second clock signal terminal, and control to connect the second control node and the third voltage terminal under the control of a reset signal provided by the reset terminal, control to connect the second control node and the second clock signal terminal under the control of the potential of the first control node, and control to connect the second control node and the second clock signal terminal under the control of the potential of the first control node.

7. The driving circuit according to claim 1, further comprising a first output circuit; wherein the first output circuit is electrically connected to the first node and a driving signal output terminal respectively, and the first output circuit is electrically connected to a third voltage terminal or an output clock signal terminal, and is configured to control to connect the driving signal output terminal and the third voltage terminal or the output clock signal terminal under the control of the potential of the first node;

or wherein the second node control circuit comprises a first transistor;

a gate electrode of the first transistor is electrically connected to the second control node, a first electrode of the first transistor is electrically connected to the first clock signal terminal, and a second electrode of the first transistor is electrically connected to the second node.

8. The driving circuit according to claim 1, further comprising a first energy storage circuit and a second energy storage circuit; wherein a first terminal of the first energy storage circuit is electrically connected to the first node, and a second terminal of the first energy storage circuit is electrically connected to the driving signal output terminal; the first energy storage circuit is configured to maintain the potential of the first node;

a first terminal of the second energy storage circuit is electrically connected to the second node, and a second terminal of the second energy storage circuit is electrically connected to the second voltage terminal; the second energy storage circuit is configured to maintain the potential of the second node.

9. The driving circuit according to claim 1, wherein the fourth node control circuit comprises a second transistor and a third transistor;

a gate electrode of the second transistor is electrically connected to the first node, a first electrode of the second transistor is electrically connected to the first voltage terminal, and a second electrode of the second transistor is electrically connected to the fourth node;

a gate electrode of the third transistor is electrically connected to the first clock signal terminal, a first electrode of the third transistor is electrically connected to the third node, and a second electrode of the third transistor is electrically connected to the fourth node;

or wherein the third node control circuit comprises an eighth transistor and a third capacitor; a gate electrode of the eighth transistor is electrically connected to the first control node, and a first electrode of the eighth transistor is connected to the first clock signal terminal, and a second electrode of the eighth transistor is electrically connected to the third node;

a first terminal of the third capacitor is electrically connected to the first control node, and a second terminal of the third capacitor is electrically connected to a third node;

the second node control circuit also includes a fourth capacitor;

a first terminal of the fourth capacitor is electrically connected to the second control node, and a second terminal of the fourth capacitor is electrically connected to the second node.

10. The driving circuit according to claim 5, wherein the fifth node control circuit comprises a fourth transistor;

a gate electrode of the fourth transistor is electrically connected to the driving signal output terminal, a first electrode of the fourth transistor is electrically connected to the third voltage terminal or the first voltage terminal, and a second electrode of the fourth transistor is electrically connected to a fifth node;

or wherein the second output circuit includes a second output transistor, and the third output circuit includes a third output transistor;

a gate electrode of the second output transistor is electrically connected to the second node, a first electrode of the second output transistor is electrically connected to the driving signal output terminal, and a second electrode of the second output transistor is electrically connected to the fifth node;

a gate electrode of the third output transistor is electrically connected to the second node, a first electrode of the third output transistor is electrically connected to the fifth node, and a second electrode of the third output transistor is electrically connected to the second voltage terminal.

11. The driving circuit according to claim 4, wherein the third node control circuit further comprises a ninth transistor;

a gate electrode of the ninth transistor is electrically connected to the second node, a first electrode of the ninth transistor is electrically connected to the third node, and a second electrode of the ninth transistor is electrically connected to the second voltage terminal.

12. The driving circuit according to claim 2, wherein the first node control circuit comprises a tenth transistor;

a gate electrode of the tenth transistor is electrically connected to the first clock signal terminal, a first electrode of the tenth transistor is electrically connected to the fourth node, a second electrode of the tenth transistor is electrically connected to the first node.

13. The driving circuit according to claim 3, wherein the first node control circuit comprises an eleventh transistor;

a gate electrode of the eleventh transistor is electrically connected to the second node, a first electrode of the eleventh transistor is electrically connected to the first node, a second electrode of the eleventh transistor is electrically connected to the second voltage terminal.

14. The driving circuit according to claim 6, wherein the second control node control circuit comprises a twelfth transistor, a thirteenth transistor, and a fourteenth transistor;
a gate electrode of the twelfth transistor is electrically connected to the reset terminal, a first electrode of the twelfth transistor is electrically connected to the second control node, and a second electrode of the twelfth transistor is electrically connected to the third voltage terminal;
a gate electrode of the thirteenth transistor is electrically connected to the second clock signal terminal, a first electrode of the thirteenth transistor is electrically connected to the third voltage terminal, and a second electrode of the thirteenth transistor is electrically connected to the second control node;
a gate electrode of the fourteenth transistor is electrically connected to the first control node, a first electrode of the fourteenth transistor is electrically connected to the second clock signal terminal, and a second electrode of the fourteenth transistor is electrically connected to the second control node.

15. The driving circuit according to claim 7, wherein the first output circuit includes a first output transistor; a gate electrode of the first output transistor is electrically connected to the first node, and a first electrode of the first output transistor is electrically connected to a third voltage terminal or an output clock signal terminal, and a second electrode of the first output transistor is electrically connected to the driving signal output terminal.

16. A driving method, applied to a driving circuit which includes a first control node control circuit, a second control node control circuit, a first node control circuit and a second node control circuit, wherein the first control node control circuit is configured to control a potential of a first control node, the second control node control circuit is configured to control a potential of a second control node, the first node control circuit is configured to control a potential of a first node, the second node control circuit is electrically connected to the second control node, a first clock signal terminal and a second node respectively, and is configured to control to connect the first clock signal terminal and the second node under the control of the potential of the second control node, wherein a display period includes a first phase, a second phase and a third phase set successively; the driving method comprises:
in at least part of time period included in the first phase, controlling, by the second control node control circuit, the potential of the second control node to be a turn-on voltage; controlling, by the second node control circuit, to connect the second node and the first clock signal terminal under the control of the potential of the second control node; controlling, by the first node control circuit, the potential of the first node to be a turn-off voltage;
in a part of time period included in the second phase, controlling, by the first control node control circuit, the potential of the first control node to be the turn-on voltage; controlling, by the second control node control circuit, the potential of the second control node to be the turn-on voltage, and controlling, by the second node control circuit, to connect the second node and the first clock signal terminal under the control of the potential of the second control node;
in another part of time period included in the second phase, controlling, by the first control node control circuit, the potential of the first control node to be the turn-on voltage, controlling, by the second control node control circuit, the potential of the second control node to be the turn-off voltage, and controlling, by the second node control circuit, the potential of the second node to be the turn-off voltage, and controlling, by the first node control circuit, the potential of the first node to be the turn-on voltage;
in a part of time period included in the third phase, controlling, by the first control node control circuit, the potential of the first control node to be the turn-off voltage, controlling, by the second control node control circuit, the potential of the second control node to be the turn-on voltage, and controlling, by the second node control circuit, to connect the second node and the first clock signal terminal under the control of the potential of the second control node, and controlling, by the first node control circuit, the potential of the first node to be the turn-on voltage;
in another part of time period included in the third phase, controlling, by the second control node control circuit, the potential of the second control node to be the turn-on voltage, controlling, by the first node control circuit, the potential of the first node to be the turn-off voltage, and controlling, by the second node control circuit, to connect the second node and the first clock signal terminal under the control of the potential of the second control node.

17. A display device comprising a driving circuit; wherein the driving circuit includes a first control node control circuit, a second control node control circuit, a first node control circuit and a second node control circuit,
wherein the first control node control circuit is configured to control a potential of a first control node;
wherein the second control node control circuit is configured to control a potential of a second control node;
wherein the first node control circuit is configured to control a potential of a first node;
wherein the second node control circuit is electrically connected to the second control node, a first clock signal terminal and a second node respectively, and is configured to control to connect the first clock signal terminal and the second node under the control of the potential of the second control node;
wherein the first control node control circuit is respectively electrically connected to the first control node, the first clock signal terminal, the second control node and the second voltage terminal, is configured to control to connect the first control node and the second voltage terminal under the control of a first clock signal provided by the first clock signal terminal and the potential of the second control node; and
wherein the first control node control circuit is further electrically connected to the second clock signal terminal and an input terminal, is configured to control to connect the first control node and the input terminal under the control of a second clock signal provided by the second clock signal terminal.

18. The display device according to claim 17, wherein the first control node control circuit includes a fifth transistor and a sixth transistor; a gate electrode of the fifth transistor is electrically connected to the first clock signal terminal, and a first electrode of the fifth transistor is connected to the first control node;
- a gate electrode of the sixth transistor is electrically connected to the second control node, a first electrode of the sixth transistor is electrically connected to a second electrode of the fifth transistor, and a second electrode of the sixth transistor is electrically connected to the second voltage terminal; or
- wherein the first control node control circuit comprises a fifth transistor and a sixth transistor;
- a gate electrode of the fifth transistor is electrically connected to the second control node, and a first electrode of the fifth transistor is electrically connected to the first control node;
- a gate electrode of the sixth transistor is electrically connected to the first clock signal terminal, a first electrode of the sixth transistor is electrically connected to a second electrode of the fifth transistor, and a second electrode of the sixth transistor is electrically connected to the second voltage terminal; or
- wherein the first control node control circuit comprises a seventh transistor; a gate electrode of the seventh transistor is electrically connected to the second clock signal terminal, and a first electrode of the seventh transistor is connected to the input terminal, and a second electrode of the seventh transistor is electrically connected to the first control node.

* * * * *